United States Patent
Ronan et al.

(10) Patent No.: US 7,570,089 B2
(45) Date of Patent: *Aug. 4, 2009

(54) OUTPUT STAGE INTERFACE CIRCUIT FOR OUTPUTTING DIGITAL DATA ONTO A DATA BUS, AND A METHOD FOR OPERATING AN OUTPUT STAGE INTERFACE CIRCUIT

(75) Inventors: Colm Patrick Ronan, Caherconlish (IE); John Twomey, Fountainstown (IE); Brian Anthony Moane, Raheen (IE); Liam Joseph White, County Limerick (IE)

(73) Assignee: Analog Devices, Inc., Norwood, MA (US)

( * ) Notice: Subject to any disclaimer, the term of this patent is extended or adjusted under 35 U.S.C. 154(b) by 221 days.

This patent is subject to a terminal disclaimer.

(21) Appl. No.: 11/589,020

(22) Filed: Oct. 27, 2006

(65) Prior Publication Data

US 2007/0159219 A1 Jul. 12, 2007

Related U.S. Application Data

(63) Continuation-in-part of application No. 11/262,224, filed on Oct. 28, 2005, now Pat. No. 7,233,179.

(60) Provisional application No. 60/834,072, filed on Jul. 28, 2006.

(51) Int. Cl.
*H03B 1/00* (2006.01)

(52) U.S. Cl. .................. 327/112; 327/382; 327/534

(58) Field of Classification Search .................. 327/534, 327/112, 382
See application file for complete search history.

(56) References Cited

U.S. PATENT DOCUMENTS

| 5,113,096 | A | 5/1992 | Lev et al. |
| 5,414,314 | A | 5/1995 | Thurber, Jr. |
| 5,592,142 | A | 1/1997 | Adams et al. |
| 5,804,861 | A | 9/1998 | Leach |
| 5,966,041 | A | 10/1999 | Moane |
| 6,525,594 | B2 | 2/2003 | Fugate et al. |
| 6,646,490 | B1 | 11/2003 | Braun |

*Primary Examiner*—Lincoln Donovan
*Assistant Examiner*—Ryan C Jager
(74) *Attorney, Agent, or Firm*—Wolf, Greenfield & Sacks, P.C.

(57) ABSTRACT

An output stage interface circuit for interfacing with a data bus, comprising first and second rails for receiving respectively a high voltage and a low voltage from a power supply; a data output terminal; a first main switch element coupled between said terminal and the first rail and comprising a first main MOS device having a gate and an independently configurable back gate, and responsive to a first data control signal applied to the gate pulling the voltage on the data output terminal toward the first rail voltage; and a first control circuit responsive to the voltage on said terminal being pulled from a first state across a first voltage reference to a second state for coupling said back gate to said terminal and permitting coupling of the gate of said MOS device to said terminal, the first main MOS device presenting a high impedance on the terminal when its voltage is pulled to the second state.

74 Claims, 10 Drawing Sheets

| Condition | State of Enable Signal | State of Data Control Signals on lines 8 & 9 | State of voltage on the first and second rails | State of voltage on data output terminal | Operating state of the Interface circuit | Impedance presented by interface circuit |
|---|---|---|---|---|---|---|
| 1 | 0 0 | Line 8 = 0 Line 9 = 0 | $V_{dd}$ Applied | Voltage Above $V_{dd}$ | MN1 - off Q1 - off | High Impedance |
| 2 | 0 0 | Line 8 = 0 Line 9 = 0 | $V_{dd}$ Applied | Voltage Below $V_{ref1}$ | MN1 - off Q1 - off | High Impedance |
| 3 | x x | Line 8 = x Line 9 = x | $V_{dd}$ = 0 | Voltage Above $V_{dd}$ | MN1 - off Q1 - off | High Impedance |
| 4 | x x | Line 8 = x Line 9 = x | $V_{dd}$ = 0 | Voltage Below $V_{ref1}$ | MN1 - off Q1 - off | High Impedance |
| 5 | 1 1 | Line 8 = 0 Line 9 = 1 | $V_{dd}$ Applied | Voltage Above $V_{dd}$ | MN1 - off Q1 - off | High Impedance |
| 6 | 1 1 | Line 8 = 1 Line 9 = 0 | $V_{dd}$ Applied | Voltage Above $V_{dd}$ | MN1 - on Q1 - off | Low Impedance to first rail High Impedance to second rail |
| 7 | 1 1 | Line 8 = 0 Line 9 = 1 | $V_{dd}$ Applied | Voltage Below $V_{ref1}$ | MN1 - off Q1 - on | High Impedance to first rail Low Impedance to second rail |
| 8 | 1 1 | Line 8 = 1 Line 9 = 0 | $V_{dd}$ Applied | Voltage Below $V_{ref1}$ | MN1 - off Q1 - off | High Impedance |

X may be 0 or 1 floating (unknown condition)

Fig. 5

| Condition | State of Enable Signal | State of Data Control Signals on lines 8 & 9 | State of voltage on the first and second rails | State of voltage on data output terminal | Operating state of the Interface circuit | Impedance presented by interface circuit |
|---|---|---|---|---|---|---|
| 1 | 0 0 | Line 8 = 0<br>Line 9 = 1 | $V_{dd}$ Applied | Voltage Above $V_{dd}$ | MN1 - off<br>MP2 - off | High Impedance |
| 2 | 0 0 | Line 8 = 0<br>Line 9 = 1 | $V_{dd}$ Applied | Voltage Below $V_{ref1}$ | MN1 - off<br>MP2 - off | High Impedance |
| 3 | x x | Line 8 = x<br>Line 9 = x | $V_{dd}$ = 0 | Voltage Above $V_{dd}$ | MN1 - off<br>MP2 - off | High Impedance |
| 4 | x x | Line 8 = x<br>Line 9 = x | $V_{dd}$ = 0 | Voltage Below $V_{ref1}$ | MN1 - off<br>MP2 - off | High Impedance |
| 5 | 1 1 | Line 8 = 0<br>Line 9 = 0 | $V_{dd}$ Applied | Voltage Above $V_{dd}$ | MN1 - off<br>MP2 - off | High Impedance |
| 6 | 1 1 | Line 8 = 1<br>Line 9 = 1 | $V_{dd}$ Applied | Voltage Above $V_{dd}$ | MN1 - on<br>MP2 - off | Low Impedance to first rail<br>High Impedance to second rail |
| 7 | 1 1 | Line 8 = 0<br>Line 9 = 0 | $V_{dd}$ Applied | Voltage Below $V_{ref1}$ | MN1 - off<br>MP2 - on | High Impedance to first rail<br>Low Impedance to second rail |
| 8 | 1 1 | Line 8 = 1<br>Line 9 = 1 | $V_{dd}$ Applied | Voltage Below $V_{ref1}$ | MN1 - off<br>MP2 - off | High Impedance |

X may be 0 or 1 floating (unknown condition)

Fig. 9

OUTPUT STAGE INTERFACE CIRCUIT FOR OUTPUTTING DIGITAL DATA ONTO A DATA BUS, AND A METHOD FOR OPERATING AN OUTPUT STAGE INTERFACE CIRCUIT

RELATED APPLICATIONS

This application claims priority under 35 USC 119(e) to provisional application No. 60/834,072, titled OUTPUT STAGE INTERFACE CIRCUIT FOR OUTPUTTING DIGITAL DATA ONTO A DATA BUS, filed Jul. 28, 2006; and under 35 USC 120, as a continuation-in-part of application Ser. No. 11/262,224, titled OUTPUT STAGE INTERFACE CIRCUIT FOR OUTPUTTING DIGITAL DATA ONTO A DATA BUS, filed Oct. 28, 2005, both of which are hereby incorporated by reference.

FIELD OF THE INVENTION

The present invention relates to an output stage interface circuit for interfacing, for example, a digital signal processing circuit with a data bus for outputting digital data onto the data bus, and the invention also relates to a method for operating an output stage interface circuit, and in particular, for operating the output stage interface circuit for presenting a high impedance to the data bus on the voltage on the data bus being outside the power supply voltage of the output stage interface circuit.

BACKGROUND TO THE INVENTION

Interface circuits for interfacing an output stage of a digital signal processing device with a data bus, and in particular with a shared data bus, for outputting digital data onto the data bus are known. Such interface circuits must comply with the operating transmission standard of the data bus. Such transmission standards are, for example, RS485, RS422, RS232 and CANbus standards. Such standards permit the voltage on the data bus and in particular the common mode voltage of different signals to vary within relatively wide voltage ranges. For example, the RS485 standard permits the common voltage of differential signals to vary between +12 volts and −7 volts. Indeed, some transmission standards permit differential data buses to operate with common mode voltages within voltage ranges wider than the permitted voltage range of the RS485 standard. Many digital signal processing devices operate at relatively low supply voltages, for example, laptop computers operate with a supply voltage of 5 volts, and may operate with supply voltages as low as 3 volts. Indeed, the majority of CMOS and BiCMOS circuits operate at supply voltages between 3 volts and 5 volts. Accordingly, interface circuits for interfacing an output stage of a digital signal processing device to a data bus operating within the RS485 transmission standard or other transmission standards which permit common mode voltages within a relatively wide voltage range must be capable of presenting a high impedance to the data bus over at least the permitted voltage range of the data bus, in order to avoid currents being sourced to the data bus from the interface circuit or vice versa.

Additionally, the RS485 transmission standard and other transmission standards require that a data output signal produced by an interface circuit for applying to the data bus be produced with a relatively high voltage swing between the logic high level and the logic low level. For example, the RS485 standard requires that the data output signal deliver a differential output voltage of 1.5 volts across a differential load resistor of 54 ohms. Accordingly, low voltage circuits, for example, CMOS and BiCMOS output stage interface circuits operating with a 3 volt supply require that the on-resistance of driver transistors which drive the data output terminal of such interface circuits to the logic high and logic low voltage levels be relatively low, in order to provide the necessary output voltage swing. This requires that the die area of the driver transistors be sufficient to produce the appropriate relatively low on-resistance.

A typical elementary prior art output stage interface circuit, which is implemented by a CMOS process is illustrated in FIG. 1, and is indicated generally by the reference numeral 100. Power supply rails, namely, a first rail 101, and a second rail 102 receive a power supply, typically a 3 volt power supply $V_{DD}$. The first rail 101 is held at ground, and the positive supply voltage $V_{DD}$ is applied to the second rail 102. Digital data is outputted onto a data bus (not shown) through a data output terminal 103. An NMOS transistor 105 couples the data output terminal 103 to the first rail 101, and a PMOS transistor 106 couples the data output terminal 103 to the second rail 102. A data control circuit 107 in response to digital data inputted from a digital signal processing circuit (not shown) outputs first and second data control signals to gates of the respective NMOS and PMOS transistors 105 and 106, respectively, for selectively operating the transistors 105 and 106 for determining the logic high and logic low voltage states of the data output terminal 103, for in turn outputting the data in digital form onto the data bus, and also for simultaneously disabling the NMOS and PMOS transistors 105 and 106, in other words, for simultaneously holding the transistors 105 and 106 in the off-state during periods when data is not being outputted to the data bus.

In this specification the terms "on-state" and "off-state" when used in conjunction with a transistor are used to refer to the low impedance state and the high impedance state, respectively, of the transistor. Additionally, the term "diode voltage drop" when used in this specification is used to refer to the threshold voltage at which a diode commences to conduct current, and as will be understood by those skilled in the art, is dependent on the types of P-type and N-type materials from which the diode junction is formed, and in general, ranges from 0.3 volts to 0.7 volts.

However, a problem with the prior art interface circuit 100 occurs when the voltage on the data output terminal 103 is pulled by the voltage on the data bus to a voltage above the supply voltage $V_{DD}$ on the second rail 102, or below the ground voltage on the first rail 101. Once the voltage on the data output terminal 103 is pulled by the voltage on the data bus above the supply voltage $V_{DD}$ on the second rail 102 by a diode voltage drop of approximately 0.7 volts, a parasitic diode $D_{p1}$ between the back gate and the drain of the PMOS transistor 106 becomes sufficiently forward biased to conduct, and since the back gate of the PMOS transistor 106 is shorted to the source, current is sourced from the data bus to the interface circuit. Additionally, when the voltage on the data output terminal 103 is pulled by the voltage on the data bus to a voltage below the ground voltage on the first rail 101 by a diode voltage drop of approximately −0.7 volts, a parasitic diode $D_{p2}$ between the back gate and the drain of the NMOS transistor 105 becomes sufficiently forward biased to conduct, and since the back gate of the NMOS transistor 105 is shorted to the source, current is sourced from the interface circuit to the data bus. Neither of these conditions is permissible.

Output stage interface circuits which have overcome the problem of sourcing current to and from the data bus are disclosed in U.S. Pat. No. 5,966,041 of Brian Moane, and in U.S. Pat. No. 5,414,314 of Charles Thurber. However, in the interface circuit disclosed in U.S. Pat. No. 5,966,041 of Moane, two NMOS transistors coupled in series between the data output terminal and the ground rail determine the logic low voltage state of the data output terminal. The two NMOS transistors are arranged in series in order to prevent current being sourced from the interface circuit to the data bus, when the voltage on the data bus drops below the ground voltage on the ground rail. The disadvantage of providing two MOS transistors in series is that the on-resistance of the two MOS transistors must each be half the on-resistance of a single MOS transistor in order that the data output terminal can be driven with the same output voltage swing as with a single MOS transistor. However, in order to halve the on-resistance of a MOS transistor, the size of the MOS transistor must be doubled. Thus, the die area required by the two NMOS transistors of the interface circuit of Moane is four times that which would be required by the NMOS transistor 105 of the prior art interface circuit 100 of FIG. 1.

The interface circuit disclosed in U.S. Pat. No. 5,414,314 of Thurber also requires two NMOS transistors to be coupled in series between the data output terminal and the ground rail, and also requires two PMOS transistors to be coupled between the data output terminal and the high voltage rail of the supply voltage. Accordingly, the die area required by the interface circuit of Thurber is four times that which would be required for the prior art interface circuit 100 of FIG. 1.

With the premium being currently placed on die area in most integrated circuits, and in particular, in CMOS circuits, the quadrupling of the die area required by the two MOS transistors which couple the data output terminal to the ground rail of the interface circuit of Moane, and the quadrupling of the die area required by the interface circuit of Thurber is undesirable. There is therefore a need for an output stage interface circuit which addresses this problem.

The present invention is directed towards providing such an output stage interface circuit, and the invention is also directed towards a method for operating an output stage interface circuit which addresses the problem of prior art output stage interface circuits.

SUMMARY OF THE INVENTION

According to the invention there is provided an output stage interface circuit for interfacing with a data bus, the interface circuit comprising:

a first rail for receiving one of a high voltage and a low voltage of a power supply voltage, a second rail for receiving the other of the high voltage and the low voltage of the power supply voltage, a data output terminal for outputting data to the data bus, a first main switch element coupled between the data output terminal and the first rail for selectively determining at least one of a logic high and a logic low state of the data output terminal, the first main switch element comprising a first main MOS device having a gate and an independently configurable back gate, and being responsive to a first data control signal applied to the gate thereof for pulling the voltage on the data output terminal towards the voltage on the first rail for determining the one of the logic high and the logic low states of the data output terminal, and a first control circuit responsive to the voltage on the data output terminal being pulled from a first state across a first voltage reference to a second state for coupling the back gate of the first main MOS device to the data output terminal and for accommodating coupling of the gate of the first main MOS device to the data output terminal, so that the first main MOS device presents a high impedance on the data output terminal when the voltage on the data output terminal is pulled to the second state.

Preferably, the first voltage reference is selected to be of value so that the back gate of the first main MOS device is coupled to the data output terminal prior to the voltage on the data output terminal being pulled to a voltage sufficient to forward bias parasitic elements of the first main MOS device into a conducting state.

Advantageously, the first voltage reference is selected to be of value so that the difference between the value of the first voltage reference and the value of the voltage on the first rail is less than a diode voltage drop.

Ideally, the first voltage reference is selected to be of value so that the value of the voltage on the first rail lies between the value of the first voltage reference and the value of the voltage on the second rail.

In one embodiment of the invention the first control circuit is responsive to the voltage on the data output terminal being in the first state for coupling the back gate of the first main MOS device to the first rail, and preferably, the first control circuit is responsive to the voltage on the data output terminal being in the first state for accommodating selective coupling of the gate of the first main MOS device to the first rail in response to the first data control signal.

In one embodiment of the invention the first control circuit comprises a first switch circuit alternately operable in a first state and a second state in response to the respective first and second states of the voltage on the data output terminal, so that in the first state of the first switch circuit the back gate of the first main MOS device is coupled to the first rail and decoupled from the data output terminal, and in the second state of the first switch circuit the back gate of the first main MOS device is coupled to the data output terminal and decoupled from the first rail. Preferably, the first switch circuit comprises a pair of switch elements, one of the switch elements being provided for selectively coupling the back gate of the first main MOS device to the first rail, and the other of the switch elements being provided for selectively coupling the back gate of the first main MOS device to the data output terminal.

In one embodiment of the invention the switch elements of the first switch circuit comprise respective MOS devices, each having an independently configurable back gate, the back gates of the respective MOS devices being coupled to one of the source and drain of the corresponding MOS device for preventing parasitic elements in the MOS devices being sufficiently forward biased to conduct current when the voltage on the data output terminal is in the second state, so that the first switch circuit presents a high impedance on the data output terminal when the voltage thereon is in the second state.

In another embodiment of the invention a first primary buffer circuit is provided through which the first data control signal is applied to the gate of the first main MOS device, the first primary buffer circuit being coupled to the first control circuit, so that the first primary buffer circuit is coupled to the first rail in response to the voltage on the data output terminal being in the first state, and to the data output terminal in response to the voltage thereon being in the second state. Advantageously, the first primary buffer circuit is coupled between the second rail and the first control circuit.

In another embodiment of the invention a data control circuit is provided for producing the first data control signal, the data control circuit being responsive to the voltage on the data output terminal being pulled to the second state for outputting the first data control signal in a state to operate the first primary buffer circuit for coupling the gate of the first main MOS device to the first control circuit.

Preferably, a first monitoring circuit is provided for monitoring the state of the voltage on the data output terminal, the first monitoring circuit being responsive to the voltage on the data output terminal for outputting a first switch control signal in one of a first state and a second state corresponding to the respective first and second states of the voltage on the data output terminal, the first control circuit being responsive to the first switch control signal being in the second state for coupling the back gate of the first main MOS device to the data output terminal, and for accommodating coupling of the gate of the first main MOS device to the data output terminal.

In another embodiment of the invention a second main switch element is coupled between the data output terminal and the second rail, the second main switch element comprising a control terminal for receiving a second data control signal, the second main switch element being responsive to the second data control signal for pulling the voltage on the data output terminal towards the voltage on the second rail for determining the other one of the logic high state and the logic low states of the data output terminal.

In a further embodiment of the invention the second main switch element comprises a bipolar transistor, a base of the bipolar transistor forming the control terminal for receiving the second data control signal.

Preferably, the first control circuit is responsive to the voltage on the data output terminal being pulled from the first state across the first voltage reference to the second state for accommodating coupling of the base of the bipolar transistor to the data output terminal.

In one embodiment of the invention a second primary buffer circuit is provided through which the second data control signal is applied to the base of the bipolar transistor, the second primary buffer circuit being coupled to the first control circuit, so that the second primary buffer circuit is coupled to the first rail in response to the voltage on the data output terminal being in the first state, and to the data output terminal in response to the voltage thereon being in the second state. Preferably, the second primary buffer circuit is coupled between the second rail and the first control circuit.

In another embodiment of the invention the second main switch element comprises a second main MOS device having a gate and an independently configurable back gate, the gate forming the control terminal for receiving the second data control signal, and a second control circuit is provided responsive to the voltage on the data output terminal being pulled from the first state across a second voltage reference to a third state for coupling the back gate of the second main MOS device to the data output terminal and for accommodating coupling of the gate of the second main MOS device to the data output terminal, so that the second main MOS device presents a high impedance to the data output terminal when the voltage on the data output terminal is pulled to the third state.

Preferably, the second voltage reference is selected to be of value so that the back gate of the second main MOS device is coupled to the data output terminal prior to the voltage on the data output terminal being pulled to a voltage sufficient to forward bias parasitic elements of the second main MOS device into a conducting state.

Advantageously, the second voltage reference is selected to be of value so that the difference between the value of the second voltage reference and the value of the voltage on the second rail is less than a diode voltage drop.

Ideally, the second voltage reference is selected to be of value so that the value of the voltage on the second rail lies between the value of the second voltage reference and the value of the voltage on the first rail.

In one embodiment of the invention the second control circuit is responsive to the voltage on the data output terminal being in the first state for coupling the back gate of the second main MOS device to the second rail, and preferably, the second control circuit is responsive to the voltage on the data output terminal being in the first state for accommodating selective coupling of the gate of the second main MOS device to the second rail in response to the second data control signal.

Preferably, the second control circuit comprises a second switch circuit alternately operable in a first state and a second state in response to the respective first and third states of the voltage on the data output terminal, so that in the first state of the second switch circuit, the back gate of the second main MOS device is coupled to the second rail, and decoupled from the data output terminal, and in the second state of the second switch circuit the back gate of the second main MOS device is coupled to the data output terminal and decoupled from the second rail. Advantageously, the second switch circuit comprises a pair of switch elements, one of the switch elements being provided for selectively coupling the back gate of the second main MOS device to the second rail, and the other one of the switch elements being provided for selectively coupling the back gate of the second main MOS device to the data output terminal.

In one embodiment of the invention the switch elements of the second switch circuit comprise respective MOS devices, each having an independently configurable back gate, the back gates of the respective MOS devices being coupled to one of the source and drain of the corresponding MOS device for preventing parasitic elements in the MOS devices being sufficiently forward biased to conduct current when the voltage on the data output terminal is in the third state, so that the second switch circuit presents a high impedance on the data output terminal when the voltage thereon is in the third state.

In another embodiment of the invention a second primary buffer circuit is provided through which the second data control signal is applied to the gate of the second main MOS device, the second primary buffer circuit being coupled to the second control circuit, so that the second primary buffer circuit is coupled to the second rail in response to the voltage on the data output terminal being in the first state, and to the data output terminal in response to the voltage thereon being in the third state. Preferably, the second primary buffer circuit is coupled between the first rail and the second control circuit.

In one embodiment of the invention the data control circuit is responsive to the voltage on the data output terminal being in the third state for outputting the second data control signal in a state for operating the second primary buffer circuit to couple the gate of the second main MOS device to the second control circuit.

Preferably, a second monitoring circuit is provided for monitoring the state of the voltage on the data output terminal, the second monitoring circuit being responsive to the voltage on the data output terminal for outputting a second switch control signal in one of a first state and a second state corresponding to the respective first and third states of the voltage on the data output terminal, the second control circuit being responsive to the second switch control signal being in the second state for coupling the back gate of the second main MOS device to the data output terminal, and for accommodating coupling of the gate of the second main MOS device to the data output terminal.

Advantageously, the data control circuit is adapted for receiving digital data signals from a digital signal processing circuit, and for producing the first and second data control signals in response to the received digital data signal.

In one embodiment of the invention the first rail is adapted for receiving the low voltage of the high and low voltages of the supply voltage, and the second rail is adapted for receiving the high voltage of the high and low voltages of the supply voltage. Alternatively, the first rail is adapted for receiving the high voltage of the high and low voltages of the supply voltage, and the second rail is adapted for receiving the low voltage of the high and low voltages of the supply voltage.

In another embodiment of the invention the interface circuit is implemented by one of a CMOS and a BiCMOS process on one of a P-substrate and an N-substrate, and the first main MOS device is a first main substrate isolated MOS device. Preferably, the first main substrate isolated MOS device is a diffusion isolated MOS device having a diffused isolation well of one of P and N type different to the P and N type of the substrate. Advantageously, the diffused well is coupled to a voltage for preventing a parasitic diode between the diffused well and the back gate of the first main substrate isolated MOS device conducting during normal outputting of data through the data output terminal. Preferably, the diffused well of the first main substrate isolated MOS device is coupled to the second rail.

Additionally the invention provides an output stage interface circuit for interfacing with a data bus, the interface circuit comprising:
a first rail for receiving a low voltage of a high and low voltages power supply voltage,
a second rail for receiving the high voltage of the high and low voltages of the power supply voltage,
a data output terminal for outputting data to the data bus,
a first main switch element coupled between the data output terminal and the first rail for selectively determining the logic low state of the data output terminal, the first main switch element comprising a first main MOS device having a gate and an independently configurable back gate, and being responsive to a first data control signal applied to the gate thereof for pulling the voltage on the data output terminal towards the voltage on the first rail for determining the logic low state of the data output terminal,
a second main switch element coupled between the data output terminal and the second rail for selectively determining the logic high state of the data output terminal, the second main switch element comprising a second main MOS device having a gate and an independently configurable back gate, and being responsive to a second data control signal applied to the gate thereof for pulling the voltage on the data output terminal towards the voltage on the second rail for determining the logic high state of the data output terminal,
a first control circuit responsive to the voltage on the data output terminal being pulled from a first state across a first voltage reference to a second state for coupling the back gate of the first main MOS device to the data output terminal and for accommodating coupling of the gate of the first main MOS device to the data output terminal, so that the first main MOS device presents a high impedance on the data output terminal when the voltage on the data output terminal is pulled to the second state, and
a second control circuit responsive to the voltage on the data output terminal being pulled from the first state across a second voltage reference to a third state for coupling the back gate of the second main MOS device to the data output terminal and for accommodating coupling of the gate of the second main MOS device to the data output terminal, so that the second main MOS device presents a high impedance on the data output terminal when the voltage on the data output terminal is pulled to the third state.

The invention also provides a differential output stage interface circuit for interfacing with a differential data bus comprising a pair of output stage interface circuits according to the invention, one of the output stage interface circuits being adapted for receiving a digital data signal directly from a digital data processing circuit, and the other of the output stage interface circuits being adapted to receive the data signal from the data processing circuit through an inverter for inverting thereof, the data output terminals of the respective output stage interface circuits being adapted for coupling to respective differential lines of the differential bus.

In one embodiment of the invention the differential output stage interface circuit is adapted for interfacing with a data bus operating under the RS485 transmission standard.

The invention further provides a method for operating an output stage interface circuit for presenting a high impedance to a data bus when the voltage on the data bus pulls the voltage on a data output terminal of the output stage interface circuit in one direction outside the power supply voltage range of the output stage interface circuit, wherein the interface circuit comprises:
a first rail for receiving one of a high voltage and a low voltage of the power supply voltage,
a second rail for receiving the other of the high voltage and the low voltage of the power supply voltage,
a data output terminal for outputting data to the data bus,
a first main switch element coupled between the data output terminal and the first rail for selectively determining at least one of a logic high and a logic low state of the data output terminal, the method comprising:
providing the first main switch element as a first main MOS device having a gate and an independently configurable back gate, and being responsive to a first data control signal applied to the gate thereof for pulling the voltage on the data output terminal towards the voltage on the first rail for determining the one of the logic high and the logic low states of the data output terminal, and
coupling the gate and the back gate of the first main MOS device to the data output terminal in response to the voltage on the data output terminal being pulled from a first state across a first voltage reference to a second state outside the power supply voltage of the output stage interface circuit, so that the first main MOS device presents a high impedance to the data output terminal when the voltage on the data output terminal is pulled to the second state.

ADVANTAGES OF THE INVENTION

The advantages of the invention are many. The interface circuits according to the invention are particularly suitable for low voltage applications, and for interfacing with shared data buses, which operate within transmission standards which permit the voltage on the data bus to vary within relatively wide voltage ranges, and in particular, voltage ranges which are considerably greater than the supply voltage of the interface circuits according to the invention. A particularly important advantage of the invention is that the die area required for the interface circuits according to the invention is minimised. This is achieved by virtue of the fact that each of the first and second main switch elements for coupling the data output terminal to the corresponding one of the first and second rails are provided as single switch elements, and accordingly, the die area required for the first and second main switch elements is a quarter of that which is required for corresponding switch elements of known prior art interface circuits which require two transistors coupled in series between the data output terminal and each of the first and second rails.

The provision of the first and second main switch elements as single MOS devices is possible by virtue of the fact that the back gate of each single MOS device, namely, each main MOS device is independently configurable relative to the substrate in which the MOS device is formed. By virtue of the fact that the back gate of each main MOS device is independently configurable, the voltage on the back gate can be controlled independently of the voltage at which the substrate in which the main MOS device is formed is held. This, thus, permits the back gate of each main MOS device to be coupled to the data output terminal in the event of the voltage on the data output terminal being pulled by the voltage on the data bus below or above the supply voltage range of the interface circuit as the case may be, so that the voltage on the back gates of the main MOS devices substantially follows the voltage on the data output terminal, while the voltage on the data output terminal is pulled to a voltage below or above the supply voltage range of the interface circuit.

By virtue of the fact that the voltage on the back gate of each main MOS device substantially follows the voltage on the data output terminal while the voltage thereon is pulled below or above the supply voltage range of the interface circuit as the case may be, parasitic elements in the main MOS devices, which are coupled through the main MOS devices to the data output terminal, are prevented from being sufficiently forward biased to conduct current, and thus are prevented from sourcing current from the interface circuit to the data bus, or from the data bus to the interface circuit.

Typically, the substrate in which each main MOS device is formed is held at one of the high and the low voltages of the power supply to the interface circuit. Therefore, by virtue of the fact that the back gate of each main MOS device is independently configurable relative to the substrate, the back gate can be coupled to the data output terminal when the voltage on the data output terminal is pulled by the data bus above or below the supply voltage of the interface circuit, as the case may be, without any danger of current being sourced from the substrate through the back gate to the data bus, or vice versa. Furthermore, for normal operation of the interface circuit the back gate of each main MOS device can be coupled to the appropriate one of the first and second supply voltage rails.

By providing the first and second primary buffer circuits coupled between the appropriate one of the first and second rails, and the appropriate one of the first and second control circuits, the gate of the corresponding main MOS device can be held at the voltage on the data output terminal when the voltage on the data output terminal is pulled above or below the supply voltage range of the interface circuit as the case may be by the voltage on the data bus, thereby ensuring that the relevant main MOS device is held in the off-state while the voltage on the data output terminal is above or below the supply voltage range of the interface circuit as the case may be. This, thus, ensures that the interface circuits according to the invention present a high impedance on the data output terminal to the data bus while the voltage on the data output terminal is outside the supply voltage range of the interface circuit.

Additionally, in the output stage interface circuit in which the second main switch element comprises a bipolar transistor, by having the first and second primary buffer circuits coupled between the second rail and the first control circuit, the base of the bipolar transistor can be coupled to the data output terminal while the voltage on the data output terminal is above or below the supply voltage range of the interface circuit as the case may be, and is in a state which would otherwise operate the bipolar transistor in the on-state, thereby ensuring that the base of the bipolar transistor follows the voltage on the data output terminal, and thus preventing the bipolar transistor operating in the on-state, so that the bipolar transistor presents a high impedance on the data output terminal to the data bus.

The invention and its many advantages will become readily apparent from the following description of some preferred embodiments thereof, which are given by way of example only, with reference to the accompanying drawings.

BRIEF DESCRIPTION OF THE DRAWINGS

FIG. 5 is a table setting out the impedance presented by the output stage interface circuit of FIG. 2 to a data bus for different operating conditions of the output stage interface circuit, FIG. 9 is a table setting out the impedance presented by the output stage interface circuit of FIG. 6 to a data bus for different operating conditions of the output stage interface circuit.

DETAILED DESCRIPTION OF SOME PREFERRED EMBODIMENTS OF THE INVENTION

Figure 2:
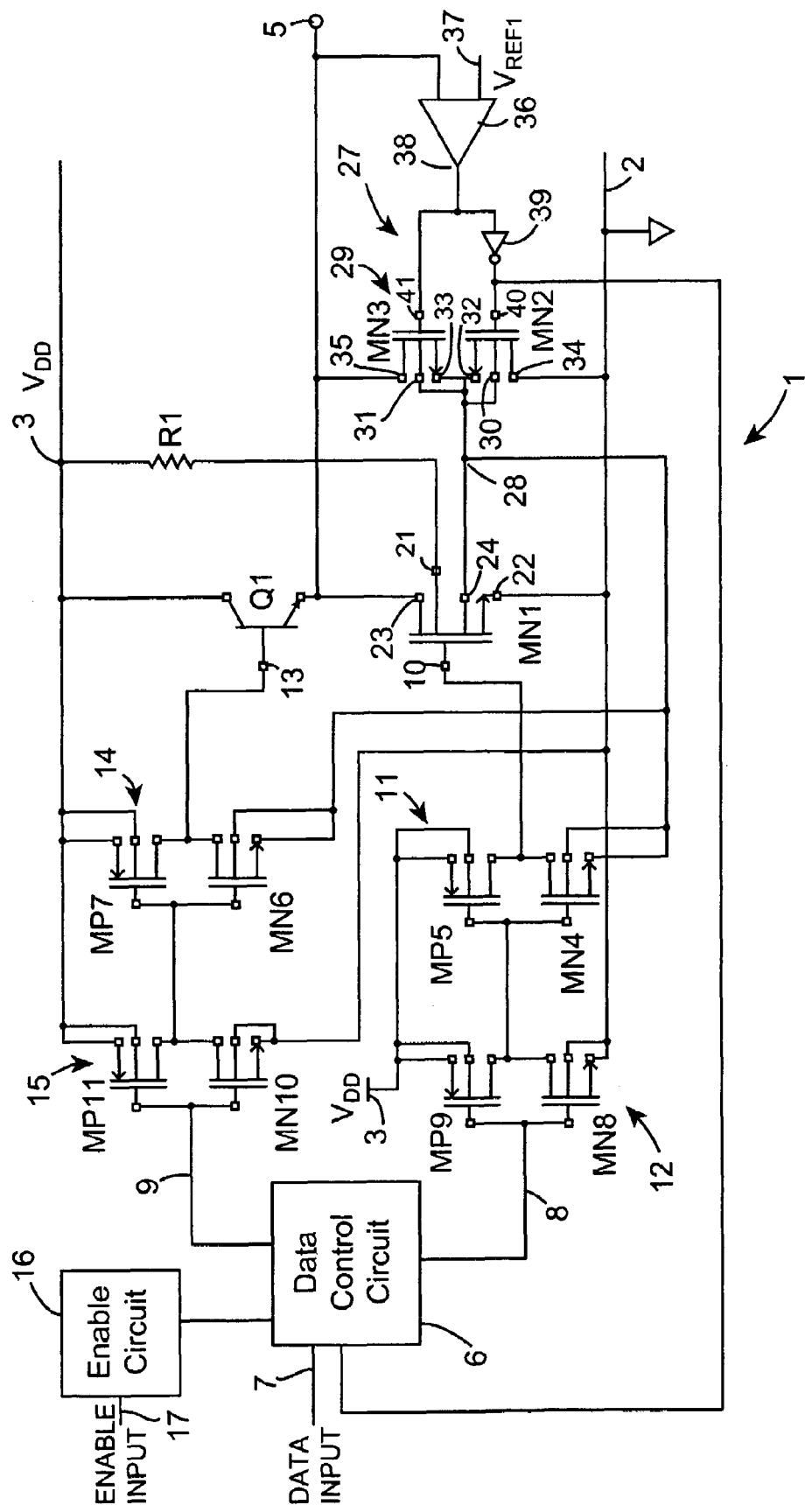
FIG. 2 is a circuit diagram of an output stage interface circuit according to the invention.
Figure 3:
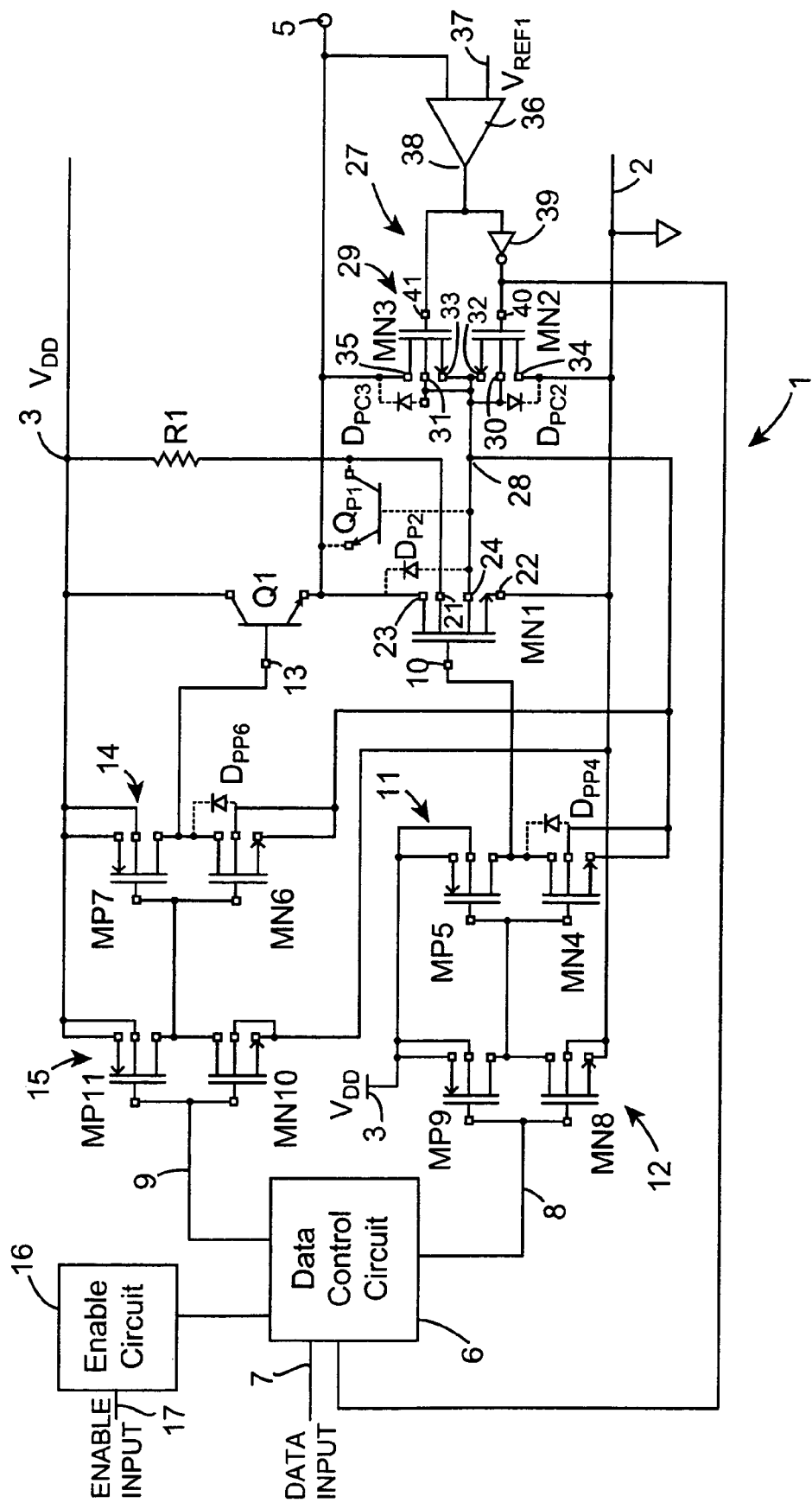
FIG. 3 is a circuit diagram of the output stage interface circuit of FIG. 2 illustrating some parasitic elements of MOS devices in the interface circuit.

Referring to the drawings and initially to FIGS. 2 and 3 thereof, there is illustrated an output stage interface circuit according to the invention, indicated generally by the reference numeral 1, for interfacing a digital signal processing circuit (not shown) with a shared data bus (also not shown) for outputting digital data from the digital signal processing circuit onto the data bus. The data bus typically would be a shared data bus which would operate to a transmission standard, which permitted a relatively wide common mode operating voltage range, typically, down to at least −7 volts, and up to at least +12 volts. The digital signal processing circuit may be any type of digital signal processing circuit or device, for example, a computer, in particular a laptop computer, or any other such digital signal processing device or circuit, which in particular, is of the type which operates with relatively low voltage power supply, typically, a +3 volts power supply. In this embodiment of the invention the interface circuit 1 is implemented as an integrated circuit in a BiCMOS process on a P-substrate, and is operable with a +3 volt power supply, and presents a high impedance to the data bus when the voltage on the data bus falls below or exceeds the power supply voltage.

The interface circuit 1 comprises first and second power supply rails 2 and 3, respectively, across which the supply voltage is applied. The first rail 2 is a ground rail to which ground of the supply voltage is applied, while the positive supply voltage $V_{DD}$ of approximately +3 volts of the supply voltage is applied to the second rail 3. A data output terminal 5 is provided from the interface circuit 1 for coupling to the data bus (not shown) for outputting the digital data to the data bus.

A first main switch element provided by a first main transistor MN1, which in this case is a substrate diffusion isolated NMOS field effect transistor, is coupled between the first rail 2 and the data output terminal 5. The first main transistor MN1 is responsive to a first data control signal from a data control circuit 6 being in a logic high state for selectively coupling the data output terminal 5 to the first rail 2 for pulling the data output terminal 5 to a logic low voltage state during data output to the data bus, as will be described below.

A second main switch element provided by a second main transistor Q1, which in this case is an NPN bipolar transistor, is coupled between the second rail 3 and the data output terminal 5. The second main transistor Q1 is responsive to a second data control signal from the data control circuit 6 being in a logic high state for selectively coupling the data output terminal 5 to the second rail 3 for pulling the data output terminal 5 to a logic high voltage state during data output to the data bus, as will also be described below.

The data control circuit 6 receives digital data from the digital signal processing circuit (not shown) on a data input 7, and converts the digital data to the first and second data control signals, which are outputted to the first main transistor MN1 and the second main transistor Q1 on first and second data control lines 8 and 9, respectively. A gate 10 of the first main transistor MN1 is coupled to the first data control line 8 through a first primary buffer circuit 11 and a first secondary buffer circuit 12, and the first data control signal is applied from the first data control line 8 to the gate 10 through the first secondary and primary buffer circuits 12 and 11, respectively. A control terminal, namely, a base 13 of the second main transistor Q1 is coupled to the second data control line 9 through a second primary buffer circuit 14 and a second secondary buffer circuit 15, and the second data control signal is applied from the second data control line 9 to the base 13 through the second secondary and primary buffer circuits 15 and 14, respectively. The first primary and secondary buffer circuits 11 and 12, and the second primary and secondary buffer circuits 14 and 15 will be described in detail below.

An enabling circuit 16 which is responsive to an enable signal on an enable input 17 is provided for enabling the interface circuit 1 when data is to be transmitted. In this embodiment of the invention a logic high state of the enable signal corresponds to an enable state, and a logic low state of the enable signal corresponds to a disable state. The data control circuit 6 is responsive to the enabling circuit 16 receiving the enable signal on the enable input 17 in the enable state for outputting the first and second data control signals on the first and second data control lines 8 and 9 in the appropriate ones of the logic high and logic low states for data transmission. The data control circuit 6 is responsive to the enabling circuit 16 receiving the enable signal on the enable input 17 in the disable state for holding the first and second data control signals on the first and second data control lines 8 and 9 in the logic low state for holding the first and second main transistors MN1 and Q1 in the high impedance off-state.

Figure 4:
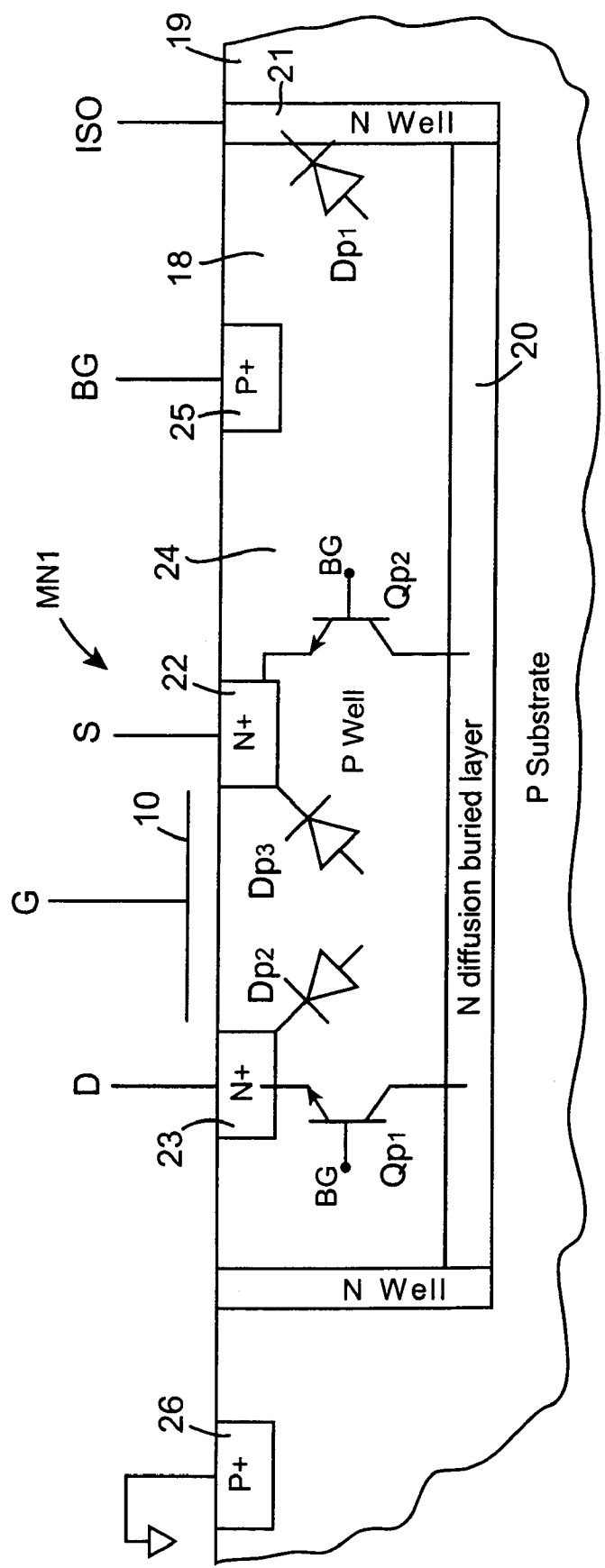
FIG. 4 is a transverse cross-sectional side elevational view of a MOS device of the output stage interface circuit of FIG. 2.

Before describing the interface circuit 1 in further detail, the first main transistor MN1 will first be described with reference to FIG. 4. The first main transistor MN1 is formed in a P-well 18 in the P-substrate in which the interface circuit 1 is formed. The P-substrate is indicated in FIG. 4 by the reference numeral 19. A buried N-diffusion layer 20 is located beneath the P-well 18, and an N-diffusion N-well 21, which extends completely around the P-well 18, co-operates electrically with the buried N-diffusion layer 20 for isolating the P-well 18 from the P-substrate 19.

N+ diffusions in the P-well 18 form a source 22 and a drain 23 of the first main transistor MN1. The gate 10 of the first main transistor MN1 is located between the N+ diffusions, which form the source 22 and drain 23 of the first main transistor MN1. The P-well 18 forms a back gate 24 of the first main transistor MN1, and a P+ diffusion 25 in the P-well 18 facilitates independent coupling the back gate 24 or P-well 18 to the interface circuit 1. Since the P-well 18 or back gate 24 of the first main transistor MN1 is isolated from the P-substrate 19, the back gate 24 is independently configurable relative to the P-substrate 19, and thus, can be held at a voltage independent of the voltage of the P-substrate 19. In this case the P-substrate 19 is held at the ground voltage on the first rail 2, and a P+ diffusion 26 in the P-substrate 19 facilitates coupling the ground voltage to the P-substrate 19. Electrically conductive contact pads (not shown) are provided in contact with the source 22, the drain 23, the gate 10, the P+ diffusion 25 of the back gate 24 and the N-well 21 for facilitating electrically connecting the first main transistor MN1 into the interface circuit 1. An electrically conductive contact pad (also not shown) is provided in contact with the P+ diffusion 26 for facilitating coupling of the P-substrate 19 to the first rail 2. The provision of such contact pads will be well known to those skilled in the art. The first main transistor MN1 is coupled between the first rail 2 and the data output terminal 5 with the source 22 coupled to the first rail 2, and the drain 23 coupled to the data output terminal 5.

Parasitic diodes $D_{p1}$, $D_{p2}$ and $D_{p3}$ exist between the P-well 18 and the N-well 21, the P-well 18 and the drain 23, and the P-well 18 and the source 22, respectively, in the first main transistor MN1. A parasitic bipolar transistor $Q_{p1}$ exists in the first main transistor MN1 between the drain 23 and the buried diffusion layer 20, with the N+ diffusion of the drain 23 forming the emitter of the parasitic bipolar transistor $Q_{p1}$, the buried diffusion layer 20 forming the collector and the P-well 18 forming the base thereof. A similar parasitic bipolar transistor $Q_{p2}$ exists between the source 22 and the buried diffusion layer 20, with the N+ diffusion of the source 22 forming the emitter of the parasitic bipolar transistor $Q_{p2}$, the buried diffusion layer 20 forming the collector and the P-well 18 forming the base thereof. However, for the purpose of the present invention the parasitic diodes $D_{p1}$ and $D_{p2}$ and the parasitic bipolar transistor $Q_{p1}$ are of most relevance. The N-well 21 of the first main transistor MN1 is coupled to the second rail 3 through a current limiting resistor R1 for holding the N-well 21 and the buried diffusion layer 20 at the supply voltage $V_{DD}$, so that the N-well 21 and the buried diffusion layer 20 are held at a voltage above the voltage on the back gate 24, in order to avoid the parasitic diode $D_{p1}$ becoming forward biased. The current limiting resistor R1 is coupled between the second rail 3 and the N-well 21 of the first main transistor MN1 in order to limit current, which would be sourced from the second rail 3 to the data output terminal 5, and in turn to the data bus through the parasitic bipolar transistor $Q_{p1}$, if the parasitic bipolar transistor $Q_{p1}$ were to operate in the on-state.

The parasitic diode $D_{p2}$ couples the back gate 24 of the first main transistor MN1 to the data output terminal 5 through the drain 23 of the first main transistor MN1. The emitter of the parasitic bipolar transistor $Q_{p1}$ is coupled to the data output terminal 5 through the drain 23, while the base of the parasitic transistor $Q_{p1}$ is formed by the back gate 24 of the first main transistor MN1. Thus, if the voltage on the data output terminal 5 were pulled by the data bus to a voltage below the voltage on the back gate 24 by an amount to sufficiently forward bias the parasitic diode $D_{p2}$ and the parasitic bipolar transistor $Q_{p1}$ into the low impedance state, namely, by a diode voltage drop, which in this case is approximately 0.7 volts, the parasitic diode $D_{p2}$ would source current from the back gate 24, and in turn from the first rail 2 to the data bus, and the parasitic bipolar transistor $Q_{p1}$ would source current from the second rail 3 through the current limiting resistor R1, the N-well 21 and the buried diffusion layer 20 to the data bus, even if the first data control signal on the gate 10 of the first main transistor MN1 were in the logic low state to hold the first main transistor MN1 in the off-state. The parasitic diode $D_{p3}$ remains reverse biased when the voltage on the data output terminal 5 is pulled below the voltage on the back gate 24, and thus is not an issue. Similarly, the base-emitter of the parasitic bipolar transistor $Q_{p2}$ remains reverse biased when the voltage on the data output terminal 5 is pulled below the voltage on the back gate 24, and thus is also not an issue.

In order to avoid current being sourced through the parasitic diode $D_{p2}$ and the parasitic bipolar transistor $Q_{p1}$, the back gate 24 of the first main transistor MN1 is selectively and alternately coupleable to the first rail 2 and the data output terminal 5 by a first control circuit 27, in response to the state of the voltage on the data output terminal 5. The first control circuit 27 is responsive to the voltage on the data output terminal 5 being in a first state, namely, at or above a first voltage reference $V_{REF1}$, for coupling the back gate 24 of the first main transistor MN1 to the first rail 2 for normal operation of the interface circuit 1, and the first control circuit 27 is responsive to the voltage on the data output terminal 5 being in a second state, namely, below the first voltage reference $V_{REF1}$, for coupling the back gate 24 of the first main transistor MN1 to the data output terminal 5, so that while the voltage on the data output terminal 5 is in the second state, the voltage on the back gate 24 follows the voltage on the data output terminal 5. Thereby, the parasitic diode $D_{p2}$ and the parasitic bipolar transistor $Q_{p1}$ are prevented from operating in the on-state when the voltage on the data output terminal 5 is pulled below the ground voltage on the first rail 2.

The value of the first voltage reference $V_{REF1}$ is selected to be less than a diode voltage drop below ground on the first rail 2, and in this case is selected to be a voltage of approximately −0.3 volts. Accordingly, once the voltage on the data output terminal 5 is pulled below −0.3 volts, the back gate 24 of the first main transistor MN1 is coupled to the data output terminal 5, thereby preventing the parasitic diode $D_{p2}$ and the base-emitter of the parasitic bipolar transistor $Q_{p1}$ from being sufficiently forward biased to conduct current. The voltage drop of 0.3 volts to which the data output terminal is allowed to be pulled below ground on the first rail 2 before the back gate 24 is coupled to the data output terminal 5 is insufficient to forward bias the parasitic diode $D_{p2}$ into the low impedance state to conduct current to the data bus from the back gate 24, and in turn from the first rail 2 to which the back gate 24 is coupled while the voltage on the data output terminal 5 is in the first state. The voltage drop of 0.3 volts to which the data output terminal 5 is allowed to be pulled below ground is also insufficient to forward bias the base-emitter of the parasitic bipolar transistor $Q_{p1}$ to operate the bipolar transistor $Q_{p1}$ in the on-state for conducting current to the data bus from the second rail 3 through the current limiting resistor R1, the N-well 21 and the buried N diffusion layer 20. Additionally, the value of the first voltage reference $V_{REF1}$ at approximately −0.3 volts is sufficiently below ground to avoid any danger of the back gate 24 of the first transistor MN1 being inadvertently coupled to the data output terminal 5 while the voltage on the data output terminal 5 is above or close to ground, which could otherwise arise due to BiCMOS process faults and variations.

The first control circuit 27 is coupled to the back gate 24 of the first main transistor MN1 through a first node 28, and comprises a first switch circuit 29 comprising a pair of first and second switch elements, namely, first and second control transistors MN2 and MN3, respectively, which are provided by NMOS field effect transistors with independently configurable back gates 30 and 31, respectively. The first and second control transistors MN2 and MN3 are described in more detail below. Sources 32 and 33 of the first and second control transistors MN2 and MN3, respectively, are coupled to the first node 28, and drains 34 and 35 of the first and second control transistors MN2 and MN3, respectively, are coupled to the first rail 2 and the data output terminal 5, respectively. The first control transistor MN2 selectively couples the first node 28 to the first rail 2, and the second control transistor MN3 selectively couples the first node 28 to the data output terminal 5. The first switch circuit 29 is operable in a first state with the first control transistor MN2 in the on-state and the second control transistor MN3 in the off-state and the first node 28 coupled to the first rail 2 and decoupled from the data output terminal 5, and in a second state with the second control transistor MN3 in the on-state and the first control transistor MN2 in the off-state and the first node 28 coupled to the data output terminal 5 and decoupled from the first rail 2.

A first monitoring circuit, namely, a first comparator 36 compares the voltage on the data output terminal 5 with the first voltage reference $V_{REF1}$, which is applied to a first voltage reference terminal 37. The first comparator 36 outputs a first switch control signal on an output 38, which is indicative of the state of the voltage on the data output terminal 5 relative to the first voltage reference $V_{REF1}$ for operating the first switch circuit 29 in the respective ones of the first and second states. The first switch control signal from the output 38 of the first comparator 36 is applied through a first inverter 39 to the gate 40 of the first control transistor MN2, and is applied directly to the gate 41 of the second control transistor MN3. The first comparator 36 outputs the first switch control signal on the output 38 in a first state, namely, in a logic low state while the voltage on the data output terminal 5 is in the first state, namely, at or above the first voltage reference $V_{REF1}$, thereby operating the first switch circuit 29 in the first state with the first control transistor MN2 in the on-state and the second control transistor MN3 in the off-state, so that the first node 28 is coupled to the first rail 2 and decoupled from the data output terminal 5. The first switch control signal is outputted in a second state, namely, in a logic high state when the voltage on the data output terminal 5 is in the second state, namely, below the first voltage reference $V_{REF1}$, thereby operating the first switch circuit 29 in the second state with the first control transistor MN2 in the off-state and the second control transistor MN3 in the on-state, so-that the first node 28 is decoupled from the first rail 2 and is coupled to the data output terminal 5 with the voltage on the first node 28, and in turn, the voltage on the back gate 24 following the voltage on the data output terminal 5.

The inverted first switch control signal from the first inverter 39 is applied to the data control circuit 6. When the data control circuit 6 is enabled by the enabling circuit 16, the data control circuit 6 is responsive to the inverted first switch control signal being in the logic low state, which is indicative of the voltage on the data output terminal 5 being pulled to the second state, for outputting the first data control signal on the first control line 8 in the logic low state for holding the first main transistor MN1 in the off-state. In this embodiment of the invention, when the data control circuit 6 is enabled, and the inverted first switch control signal from the first inverter 39 is indicative of the voltage on the data output terminal 5 being pulled to the second state, the state of the second data control signal on the second data control line 9 is determined by the data control circuit 6 in response to the data being or to be transmitted. Thus, when the interface circuit 1 is enabled by the enabling circuit 16 and the voltage on the data output terminal 5 is pulled to the second state, the second main transistor Q1 may be in the low impedance on-state, or the high impedance off-state, depending on the data transmission. This is an acceptable condition, since if the voltage on the data output terminal 5 is pulled by the voltage on the data bus to the second state as a result of a previous transmission by another device (and not as a result of a fault on the data bus), and if the second main transistor Q1 is in the low impedance state, the data output terminal 5 is pulled to the supply voltage $V_{DD}$ by the second main transistor Q1, in other words, back into the first state. This thus results in the comparator 36 outputting the switch control signal in the first state, and the first switch circuit 29 being operated in the first state with the first node 28 being coupled to the first rail 2 and decoupled from the data output terminal 5, and thereby data transmission is allowed to commence or continue, as the case may be. On the other hand, should the data bus continue to pull the data output terminal 5 to the second state, for example, as a result of a fault, suitable current limiting circuitry (not shown) and which is not relevant to the invention operates the second main transistor Q1 so that the current being sourced from the second rail 3 through the second main transistor Q1 to the data output terminal 5, and in turn to the data bus is maintained at a safe level until other appropriate action is taken, typically, by suitable software as will be well know to those skilled in the art.

Turning now to the first and second primary buffer circuits 11 and 14, the first and second primary buffer circuits 11 and 14 are coupled between the second rail 3 and the first node 28, and accordingly, are selectively coupleable to either the first rail 2 or the data output terminal 5 by the first switch circuit 29 in response to the state of the voltage on the data output terminal 5. Therefore, when the voltage on the data output terminal 5 is pulled to the second state, the first and second primary buffer circuits 11 and 14 are coupled between the second rail 3 and the data output terminal 5. Thus, when the first and second data control signals on the first and second data control lines 8 and 9 are in the logic low states, the gate 10 of the first main transistor MN1 and the base 13 of the second main transistor Q1 follow the voltage on the data output terminal 5, thereby permitting the first and second main transistors MN1 and Q1 to be held in the off-state by the first and second data control signals while the voltage on the data output terminal 5 is in the second state.

The first primary buffer circuit 11 comprises first and second primary switch elements, namely, first and second primary transistors MN4 and MP5, respectively, which are coupled in series between the second rail 3 and the first node 28. The first primary transistor MN4 comprises a substrate diffusion isolated NMOS field effect transistor having an independently configurable back gate, and the second primary transistor MP5 comprises a PMOS field effect transistor having an independently configurable back gate. The second primary buffer circuit 14 comprises first and second primary switch elements, namely, a first primary transistor MN6 and a second primary transistor MP7. The first and second primary transistors MN6 and MP7 of the second primary buffer circuit 14 are similar to the first and second primary transistors MN4 and MP5 of the first primary buffer circuit 11, and are similarly coupled in series between the second rail 3 and the first node 28. The back gates of the respective first and second primary transistors MN4 and MP5 of the first primary buffer circuit 11 and the first and second primary transistors MN6 and MP7 of the second primary buffer circuit 14 are coupled to their respective sources for preventing corresponding parasitic diodes (not shown) being sufficiently forward biased to conduct when the voltage on the data output terminal 5 is in the second state. Parasitic diodes $D_{pp4}$ and $D_{pp6}$ of the respective first primary transistors MN4 and MN6 of the first and second primary buffer circuits 11 and 14, respectively, between their respective back gates and drains are reversed biased when the voltage on the data output terminal is pulled to the second state, and thus the first and second primary transistors MN4, MP5, MN6 and MP7 of the first and second primary buffer circuits 11 and 14 present a high impedance on the data output terminal 5 to the data bus when the data output terminal 5 is pulled to the second state.

The first and second secondary buffer circuits 12 and 15 are coupled between the first rail 2 and the second rail 3. The first secondary buffer circuit 12 comprises first and second switch secondary elements, namely, first and second secondary transistors MN8 and MP9, respectively, coupled in series between the first rail 2 and the second rail 3. The first secondary transistor MN8 comprises a substrate diffusion isolated NMOS field effect transistor with an independently configurable back gate. The second secondary transistor MP9 of the first secondary buffer circuit 12 comprises a PMOS field effect transistor with an independently configurable back gate. The back gates of the first and second secondary transistors MN8 and MP9 are coupled to their respective sources for preventing parasitic elements in the first and second secondary transistors MN8 and MP9 being sufficiently forward biased to conduct current when the voltage on the data output terminal 5 is in the second state. The second secondary buffer circuit 15 comprises first and second secondary switch elements, namely, first and second secondary transistors MN10 and MP11, which are coupled in series between the first rail 2 and the second rail 3, and are similar to the first and second secondary transistors MN8 and MP9.

When the first data control signal on the first data control line 8 is in the logic high state, the first secondary transistor MN8 is in the on-state, and the second secondary transistor MP9 is in the off-state, thus applying a low to gates of the first primary transistor MN4 and the second primary transistor MP5, which in turn operates the first primary transistor MN4 in the off-state and the second primary transistor MP5 in the on-state, which in turn applies a logic high signal on the gate 10 of the first main transistor MN1. Operation of the first and second secondary transistors MN8 and MP9 and the first and second primary transistors MN4 and MP5 is reversed when the first data control signal on the first data control line 8 is in the logic low state, and thus a logic low signal is applied to the gate 10 of the first main transistor MN1. Operation of the first and second secondary transistors MN10 and MP11 of the second secondary buffer circuit 15, and the first and second primary transistors MN6 and MP7 of the second primary buffer circuit 14 in response to the logic high and logic low states of the second data control signal on the second data control line 9 is similar to that described with reference to the first secondary buffer circuit 12 and the first primary buffer circuit 11. Thus, when the voltage on the data output terminal 5 is in the second state and the first and second data control signals are in the logic low states, the first and second main transistors MN1 and Q1 are held in the off-state, since the gate 10 and the base 13 of the first and second main transistors MN1 and Q1, respectively, are held at the voltage of the data output terminal 5 through the first primary transistors MN4 and MN6, respectively, the first node 28 and the first switch circuit 29.

Accordingly, once the interface circuit 1 is disabled by the enabling circuit 16 and the first and second data control signals are in the logic low state, when the voltage on the data output terminal 5 is pulled to the second state, the first and second main transistors MN1 and Q1 are operated in the off-state, and thus, present a high impedance on the data output terminal to the data bus. Additionally, when the interface circuit 1 is enabled by the enabling circuit 16, and the voltage on the data output terminal 5 is in the second state, the first main transistor MN1 is operated in the off-state, and thus presents a high impedance on the data output terminal 5 to the data bus, and the second main transistor Q1 depending on the data transmission may or may not present a high impedance on the data output terminal 5 to the data bus. However, this condition where the second main transistor Q1 presents a low impedance on the data output terminal 5 to the data bus is an acceptable condition, as discussed above.

In this embodiment of the invention the first and second control transistors MN2 and MN3 of the first switch circuit 29 are substrate diffusion isolated NMOS transistors with diffusion isolation similar to that of the first main transistor MN1, and with the respective back gates 30 and 31 independently configurable. The diffusion isolation (not shown) of the first and second control transistors MN2 and MN3 are coupled to the second rail 3 in similar fashion as the diffusion isolation, namely, the buried layer 20 and the N-well 21 of the first main transistor MN1 is coupled to the second rail 3. The back gate 30 of the first control transistor MN2 is connected to the source 32 thereof, in order to avoid a parasitic diode (not shown) between the back gate 30 and the source 32 of the first control transistor MN2 being forward biased when the voltage on the data output terminal 5 is pulled to the second state below the first voltage reference $V_{REF1}$ and the second control transistor MN3 is in the on-state. A parasitic diode $D_{p2}$ between the back gate 30 and the drain 34 of the first control transistor MN2 remains reverse biased when the voltage on the data output terminal 5 is in the second state below the first voltage reference $V_{REF1}$. When the voltage on the data output terminal 5 is in the first state at or above the first voltage reference $V_{REF1}$, the first control transistor MN2 is in the on-state and the back gate 30 thereof is held at ground, and thus, the voltage across the parasitic diode $D_{pa2}$ of the first control transistor MN2 is zero. Thus, the first control transistor MN2 presents a high impedance to the data output terminal 5 when the voltage on the data output terminal 5 is in both the first and second states.

The back gate 31 of the second control transistor MN3 is connected to the source 33 thereof, in order to avoid a parasitic diode (not shown) between the back gate 31 and the source 32 thereof being forward biased when the voltage on the data output terminal 5 is in the first state at or above the first voltage reference $V_{REF1}$, and the first control transistor MN2 is in the on-state. A parasitic diode $D_{pc3}$ between the back gate 31 and the drain 35 of the second control transistor MN3 is reverse biased when the voltage on the data output terminal 5 is above ground and the first control transistor MN2 is in the on-state. When the voltage on the data output terminal 5 is between ground and the first voltage reference $V_{REF1}$ and the first control transistor MN2 is in the on-state, the parasitic diode $D_{pc2}$ is insufficiently forward biased to conduct, and when the voltage on the data output terminal 5 is in the second state below the first voltage $V_{REF1}$, the voltage across the parasitic diode $D_{pc2}$ is approximately zero, since the second control transistor MN3 will be in the on-state and the back gate 31 will follow the voltage on the data output terminal 5. Thus, the second control transistor MN3 presents a high impedance to the data bus when the voltage on the data output terminal 5 is both in the first and second states.

The die areas of the first main transistor MN1 and the second main transistor Q1 are selected to provide the first main transistor MN1 and the second main transistor Q1 with respective on-resistances, which are sufficiently low so that the voltage swing between the logic high and the logic low voltage states of the data output terminal 5, which are derived from the power supply voltage applied to the first and second rails 2 and 3, is sufficient to comply with the transmission standard of the data bus.

In use, while the voltage on the data output terminal 5 is in the first state, namely, at or above the first reference voltage $V_{REF1}$, the first switch control signal on the output 38 of the first comparator 36 is in the first logic low state, which operates the first switch circuit 29 in the first state with the first node 28 coupled to the first rail 2 and decoupled from the data output terminal 5. With the voltage on the data output terminal in the first state, when data is to be outputted through the data output terminal 5 in response to digital data on the data input 7, the enabling circuit 16 is enabled by the enable signal on the enable input 19 going high, thus enabling the interface circuit 1. The data control circuit 6 outputs the first and second data control signals on the first and second data control lines 8 and 9, respectively, in the appropriate ones of the logic high and logic low states for operating the first main transistor MN1 and the second main transistor Q1 in the appropriate ones of the on-state and the off-state for pulling the data output terminal 5 to the appropriate ones of the logic high and the logic low states. When the data output terminal 5 is to be pulled to the logic high state, the first data control signal on the first data control line 8 is in the logic low state, while the second data control signal on the second data control line 9 is in the logic high state. The first and second secondary buffer circuits 12 and 15 invert the first and second data control signals, respectively, which are inverted again by the first and second primary buffer circuits 11 and 14, respectively, before being applied to the gate 10 and the base 13 of the first and second main transistors MN1 and Q1, respectively, for operating the first main transistor MN1 in the off-state and the second main transistor Q1 in the on-state. When the data output terminal 5 is to be pulled to the logic low state, the logic states of the first and second data control signals are reversed.

When the voltage on the data output terminal 5 is pulled by the voltage on the data bus to the second state below the first voltage reference $V_{REF1}$, the first comparator 36 outputs the first switch control signal on the output 38 in the second logic high state, which operates the first switch circuit 29 in the second state for decoupling the first node 28 from the first rail 2 and coupling the first node 28 to the data output terminal 5. With the back gate 24 of the first main transistor MN1 coupled to the data output terminal 5, the parasitic diode $D_{p2}$ and the parasitic transistor $Q_{p1}$ of the first main transistor MN1 are held in the high impedance state. Thus, when the interface circuit 1 is enabled by the enabling circuit 16 and the data output terminal 5 is in the second state, the inverted first switch control signal from the first inverter 39 causes the data control circuit 6 to output the first data control signal on the first data control line 8 in the logic low state for in turn operating the first main transistor MN1 in the off-state. With the gate 10 of the first main transistor MN1 coupled to the data output terminal 5, the voltage on the gate 10 follows the voltage on the data output terminal 5, and thus the first main transistor MN1 is held in the off-state, and thus presents a high impedance to the data bus on the data output terminal 5. As mentioned above, the current limiting circuitry (not shown) operates the second main transistor Q1 to limit the current being drawn therethrough to a safe level if the second main transistor Q1 is in the on-state, and the data bus continues to pull the data output terminal 5 to the second state, as a result of a fault or otherwise.

When the output stage interface circuit 1 is disabled as a result of the enable signal on the enable input of the enable circuit 16 being in the disabled state, the first and second data control signals applied to the first and second data control lines 8 and 9 by the data control circuit 6 are applied in the logic low states, thereby holding the first and second main transistors MN1 and Q1 in the off-state. Additionally, when the output stage interface circuit 1 is in the disabled state, should the voltage on the data output terminal 5 be pulled to the second state, the first switch circuit 29 in response to the first switch control signal on the output 38 of the comparator 36 is operated in the second state and decouples the first node 28 from the first rail 2 and couples the first node 28 to the data output terminal 5. Thereby, the parasitic diode $D_{p2}$ and the parasitic transistor $Q_{p1}$ of the first main transistor MN1 are held in the non-conducting state, and since the gate 10 of the first main transistor MN1 and the base 13 of the second main transistor Q1 are coupled through the respective first and second primary buffer circuits 11 and 14 to the first node 28, the voltage on the gate of the first main transistor MN1 and on the base 13 of the second main transistor Q1 follows the voltage on the data output terminal 5, thereby holding the first and second main transistors MN1 and Q1 in the high impedance off-state. Thus, when the output stage interface circuit 1 is in the disabled state, and the voltage on the data output terminal 5 is in the second state, the output stage interface circuit 1 presents a high impedance on the data output terminal 5 to the data bus.

Accordingly, for as long as the voltage on the data output terminal 5 is in the second state, namely, below the first voltage reference $V_{REF1}$, and the enabling circuit 16 is disabled, the second main transistor Q1 presents a high impedance to the data output terminal 5. The first main transistor MN1 also presents a high impedance to the data output terminal 5. Since the voltage on the back gate 24 of the first main transistor MN1 follows the voltage on the data output terminal 5, the voltage across the parasitic diode $D_{p2}$ in the first main transistor MN1 is approximately zero volts, and thus, prevented from operating in the on-state, and the voltage across the base-emitter of the parasitic transistor $Q_{p1}$ in the first main transistor MN1 is also approximately zero volts, thus preventing the parasitic transistor $Q_{p1}$ operating in the on-state. Accordingly, the parasitic diode $D_{p2}$ and the parasitic transistor $Q_{p1}$ of the first main transistor MN1 both present a high impedance on the data output terminal 5 to the data bus while the voltage on the data output terminal 5 is pulled to the second state below the first voltage reference $V_{REF1}$ by the data bus. The first and second primary buffer circuits 11 and 14 also present a high impedance to the data output terminal 5, as does the first switch circuit 29 as already described for as long as the voltage on the data output terminal 5 is in the second state.

When the data output terminal 5 is in the second state and the enabling circuit 16 is enabled, thereby enabling the interface circuit 1, the first data control circuit 6 outputs the first control signal in the logic low state, thus holding the first main transistor MN1 in the off-state. However, the state of the second data control signal on the second data control line 9 is determined by the data control circuit 6 in response to the data input signal on the data input 7. If the first data control signal is in the logic low-state, the second main transistor Q1 is in the off-state, and thus presents a high impedance to the data bus on the data output terminal 5. However, if the second control signal is in the logic high state, the second main transistor Q1 is in the on-state, and thus pulls up the voltage on the data output terminal to the supply voltage $V_{DD}$ if the data bus is in the second state as a result of a previous transmission on the data bus by another device, and data transmission can commence or continue as the case may be. However, if the data output terminal 5 continues to be held in the second state by the data bus as a result of a fault, the current limiting circuitry (not shown) limits the current being drawn through the second main transistor Q1 to a safe state until appropriate action is taken by controlling software (not shown).

If the voltage on the data output terminal 5 is pulled to a value between ground and the first voltage reference $V_{REF1}$ by the voltage on the data bus, while the voltage on the data output terminal 5 is between ground and the first voltage reference $V_{REF1}$, the parasitic bipolar transistor $Q_{p1}$ and the parasitic diode $D_{p2}$ of the first main transistor MN1 will be insufficiently forward biased to operate in the on-state, as will the relevant parasitic diodes of the first and second control transistor MN2 and MN3, and in the first primary transistors MN4 and MN6 of the first and second primary buffer circuits 11 and 14, respectively. Thus, the interface circuit 1 also presents a high impedance to the data bus in the event of the voltage on the data output terminal 5 being pulled to a voltage between ground and the first voltage reference $V_{REF1}$.

Additionally, should the voltage on the data bus pull the data output terminal 5 to a voltage above the supply voltage $V_{DD}$ on the second rail 3, the second main transistor Q1 remains in the off-state, since its base-emitter will be reversed biased.

When the voltage on the data output terminal 5 is pulled above the supply voltage $V_{DD}$, the state of the first main transistor MN1 is determined by the state of the data control circuit 6 in response to the state of the enabling circuit 16, and the data, if data is to be, or is being transmitted. If the enabling circuit 16 is disabled, thus disabling the interface circuit 1, the first data control signal is in the logic low state, and the first main transistor MN1 is thus held in the high impedance off-state. If the enabling circuit is enabled, thus enabling the interface circuit 1, the state of the first data control signal is determined by the data being transmitted. Thus, if the first data control signal is in the logic low state, the first main transistor MN1 is in the high impedance off-state, and since the parasitic diode $D_{p2}$ and the base-emitter of the parasitic transistor $Q_{p1}$ will be reversed biased, and the voltage across the parasitic diode $D_{p3}$ and across the base-emitter of the parasitic transistor $Q_{p2}$ will be zero volts due to the first switch circuit being in the first state, the first main transistor MN1 presents a high impedance on the data output terminal 5. On the other hand, if the first data control signal is in the logic high state, the first main transistor MN1 is in the low impedance on-state. Thus, if the data output terminal 5 is being held above the supply voltage $V_{DD}$ as a result of a previous data transmission on the data bus by another device, the data output terminal 5 is pulled to the ground voltage on the first rail 2 through the first main transistor MN1, thus enabling data transmission to commence or continue, as the case may be. However, if the voltage on the data output terminal 5 continues to be held above the supply voltage $V_{DD}$ by the data bus as a result of a fault on the data bus, the current limiting circuitry (not shown) which has been referred to above for operating the second main transistor Q1 to limit current being drawn therethrough also operates the first main transistor MN1 to limit the current being sourced through the first main transistor MN1 from the first rail 2 to the data bus through the data output terminal to a safe level, should the fault on the data bus continue to pull the voltage on the data output terminal 5 above the supply voltage $V_{DD}$ on the second rail 3. The current limiting circuitry (not shown) operates the first main transistor MN1 to limit the current being drawn therethrough until appropriate action is taken by the software (also not shown) but referred to above in conjunction with the current limiting circuitry.

Additionally, when the voltage on the data output terminal 5 is pulled above the supply voltage $V_{DD}$ by the data bus, the base-emitter of the parasitic bipolar transistor $Q_{p1}$ and the parasitic diode $D_{p2}$ of the first main transistor MN1 are reversed biased, as is parasitic diode $D_{p1}$, when the voltage on the data output terminal 5 is pulled above the supply voltage $V_{DD}$. Also, when the data output terminal 5 is pulled above the supply voltage $V_{DD}$ on the second rail 3, the first switch circuit 29 remains in the first state with the first control transistor MN2 in the on-state and the second control transistor MN3 in the off-state. Accordingly, the parasitic diode $D_{pc3}$ in the second control transistor MN3 will be reversed biased and the voltage across the parasitic diode $D_{pc2}$ in the first control transistor MN2 will be zero.

Referring now to the table of FIG. 5, eight operating conditions under which the interface circuit 1 may have to operate are set out where the voltage on the data output terminal 5 is pulled either below the voltage reference $V_{REF1}$ or above the supply voltage $V_{DD}$ on the second rail 3 when the enabling circuit is enabled, disabled or in an unknown state, which unknown state is represented by the letter "x", and which may be any one of enabled, disabled or floating. The states of the first main transistor MN1 and the second main transistor Q1 for the relevant states are also set out, as is the impedance presented by the interface circuit on the data output terminal 5 to the data bus. As can be seen, in all the operating conditions when the enabling circuit is disabled, and when the voltage on the data output terminal is either pulled above the supply voltage $V_{DD}$ on the second rail 3 or is pulled to the second state below the first voltage reference $V_{REF1}$, the impedance offered by the interface circuit on the data output terminal 5 to the data bus is always high.

Figure 6:
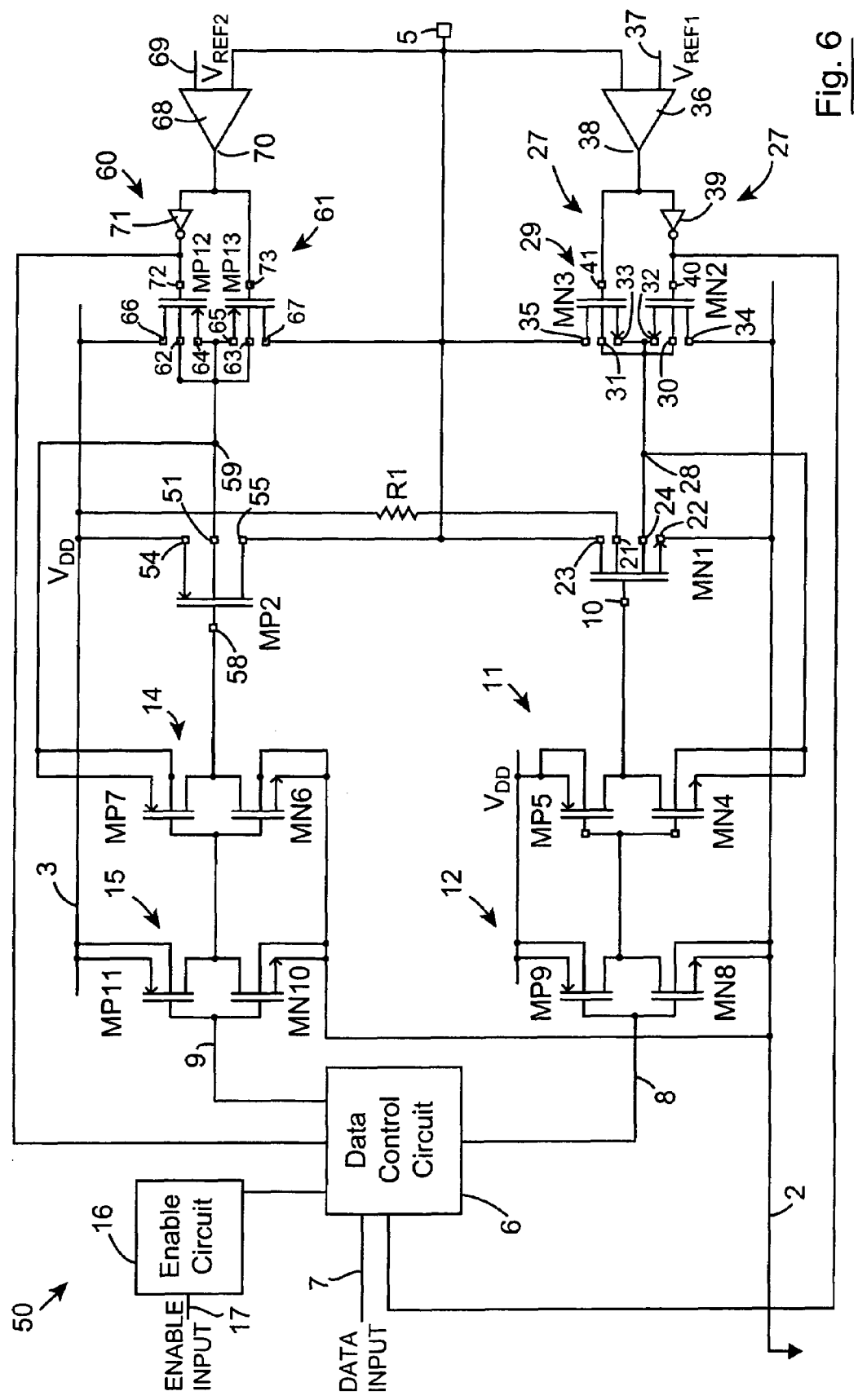
FIG. 6 is a circuit diagram of an output stage interface circuit according to another embodiment of the invention.
Figure 7:
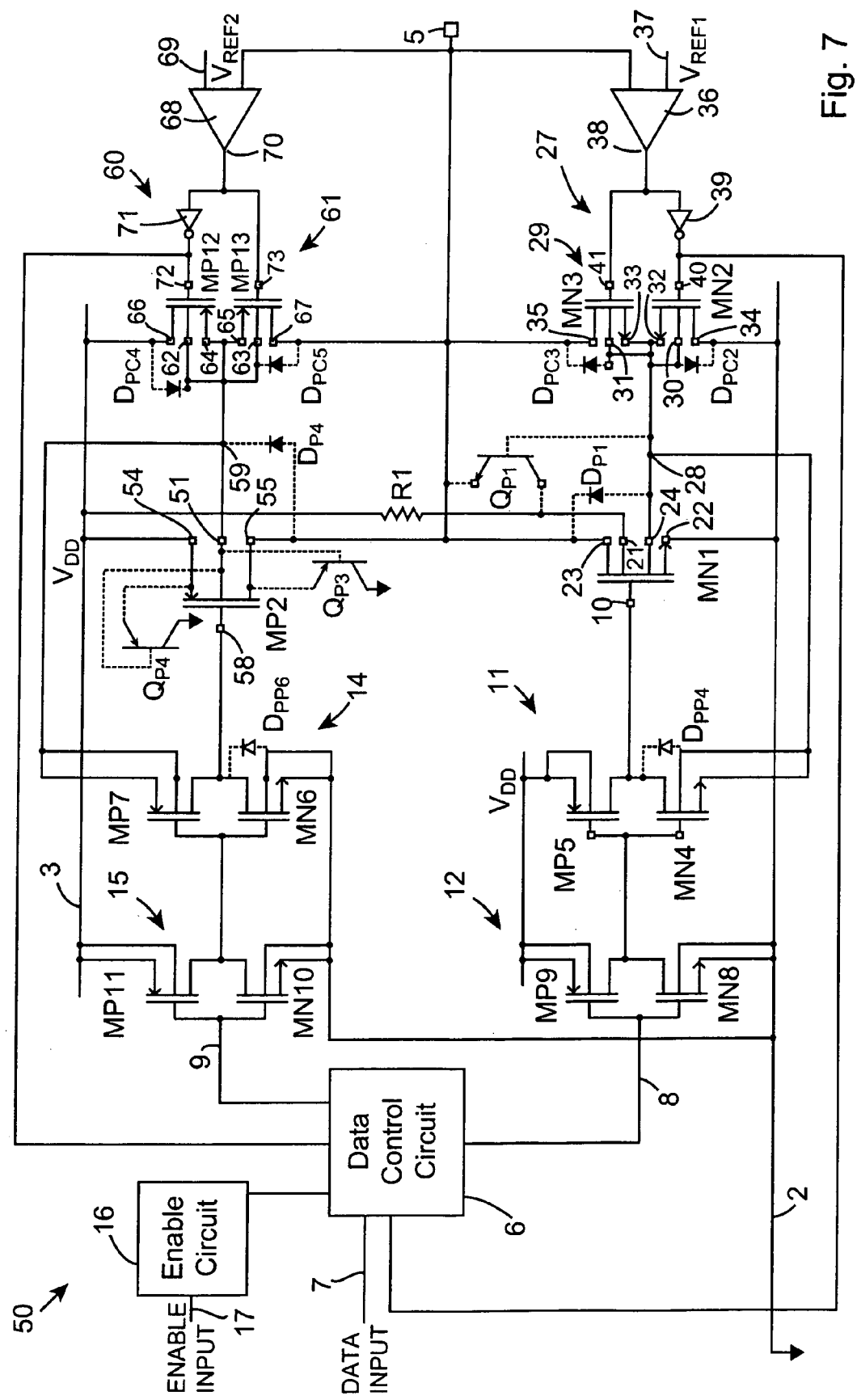
FIG. 7 is a circuit diagram of the output stage interface circuit of FIG. 6 illustrating some parasitic elements of MOS devices in the interface circuit.
Figure 8:
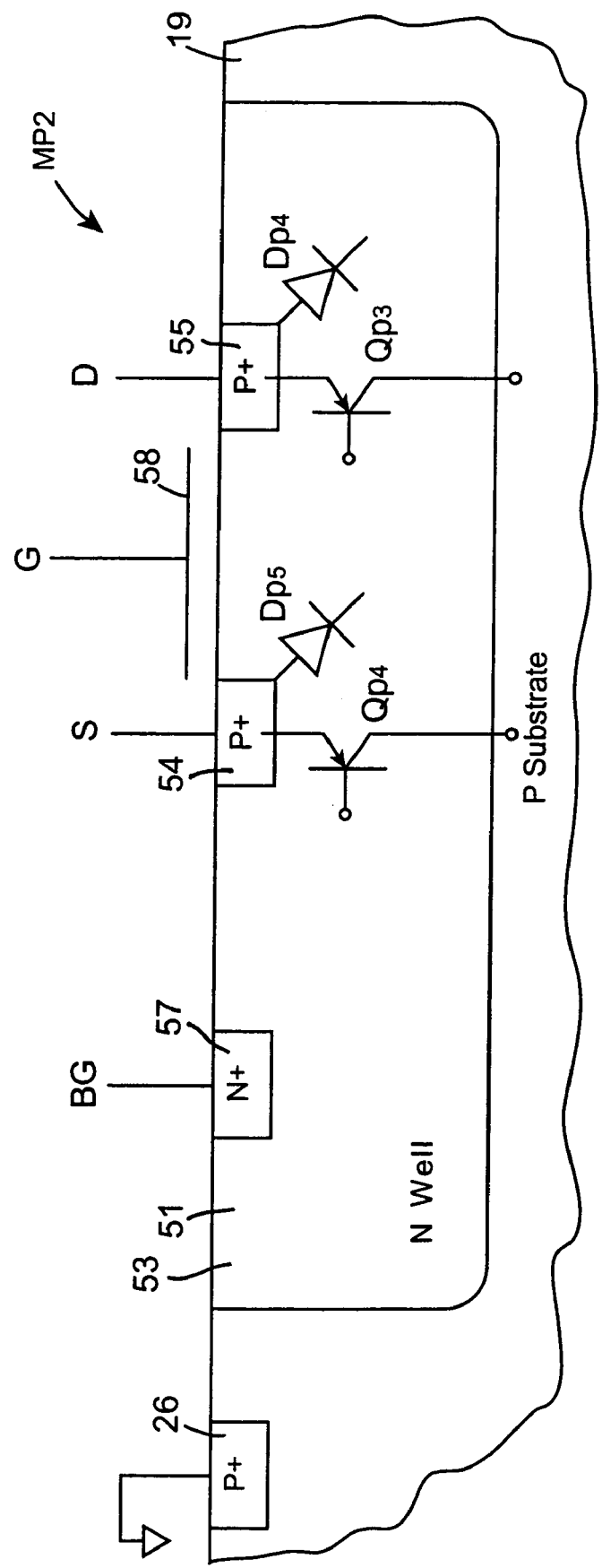
FIG. 8 is a transverse cross-sectional side elevational view of a MOS device of the output stage interface circuit of FIG. 6.

Referring now to FIGS. 6 to 8, there is illustrated an output stage interface circuit according to another embodiment of the invention, indicated generally by the reference numeral 50, for interfacing a digital signal processing circuit (not shown) with a shared data bus (also not shown) for outputting digital data from the digital signal processing circuit onto the data bus. The interface circuit 50 is substantially similar to the interface circuit 1 described with reference to FIGS. 2 to 5, and similar components are identified by the same reference numerals and letters. The main difference between the interface circuit 50 and the interface circuit 1 is that the second main switch element instead of being provided by a bipolar transistor as in the case of the interface circuit 1, in the interface circuit 50, the second main switch element is provided by a second main transistor MP2, which in this case is a PMOS field effect transistor with an independently configurable back gate 51. The second main transistor MP2 is coupled between the data output terminal 5 and the second rail 3 to which the supply voltage $V_{DD}$ is applied for selectively pulling the data output terminal 5 to the logic high state. In this embodiment of the invention since the second main bipolar transistor has been replaced by the second main transistor MP2, the interface circuit is implemented as an integrated circuit by a CMOS process on a P-substrate.

The first main transistor MN1, the first data control circuit 6 and the first switch circuit 29 are similar to the first main transistor MN1, the first data control circuit 6, and the first switch circuit 29, respectively, of the output stage interface circuit 1. Additionally, the first comparator 36, the first primary and secondary buffer circuits 11 and 12 and the second secondary buffer circuit 15 are similar to those of the output stage interface circuit 1, as is their operation, and further description should not be necessary. The second primary buffer circuit 14 of the interface circuit 50 is also similar to that of the interface circuit 1, with the exception of its coupling in the output stage interface circuit 50, as will be described below.

Before describing the interface circuit 50 further, the second main transistor MP2 will first be described with reference to FIG. 8. The second main transistor MP2 comprises an N-well 53 formed in the P-substrate 19, which forms the back gate 51. P+ diffusions in the N-well 53 form the source 54 and the drain 55 of the second main transistor MP2. An N+ diffusion 57 in the N-well 53 forms a contact to the N-well 53, which will be hereinafter referred to as the back gate 51. A parasitic PNP bipolar transistor $Q_{p3}$ is formed between the P+ diffusion of the drain 55, the back gate 51 and the P-substrate 19, with the P+ diffusion of the drain 55 forming the emitter, the back gate 51 forming the base and the P-substrate 19 forming the collector thereof. A similar parasitic PNP bipolar transistor $Q_{p4}$ is formed between the P+ diffusion of the source 54, the back gate 51 and the P-substrate 19, which is similar to the parasitic bipolar transistor $Q_{p3}$. However, the parasitic transistor $Q_{p4}$ does not become an issue in the interface circuit 50, and may be ignored. A parasitic diode $D_{p4}$ exists between the P+ diffusion of the drain 55 and the back gate 51, as does a parasitic diode $D_{p5}$ exist between the P+ diffusion of the source 54 and the back gate 51. However, the parasitic diode $D_{p5}$ is not an issue in the interface circuit 50 and may be ignored.

Referring again to FIGS. 6 and 7, the second main transistor MP2 is coupled between the second rail 3 and the data output terminal 5 with the source 54 thereof coupled to the second rail 3 and the drain 55 coupled to the data output terminal 5. The second data control signal on the second data control line 9 is applied to the gate 58 of the second main transistor MP2 through the second primary and secondary buffer circuits 14 and 15.

The back gate 51 of the second main transistor MP2 as mentioned above is independently configurable, and is coupled to a second node 59. A second control circuit 60 comprising a second switch circuit 61 is coupled to the second node 59 and is operable in respective first and second states for selectively and alternately coupling the second node 59 and in turn the back gate 51 of the second main transistor MP2 to either the second rail 3 or the data output terminal 5 in response to the state of the voltage on the data output terminal 5 being in the first state or a third state, which in this embodiment of the invention is above a second voltage reference $V_{REF2}$. The second voltage reference $V_{REF2}$ is selected to be less than a diode voltage drop above the high voltage of the supply voltage, namely, the voltage $V_{DD}$ on the second rail 3, and in this case is selected to be approximately +0.3 volts above the supply voltage $V_{DD}$.

The second switch circuit 61, as will be described below, is operated in the first state to couple the second node 59, and in turn the back gate 51 of the second main transistor MP2 to the second rail 3 while the voltage on the data output terminal 5 is in the first or second states, namely, at or below the second voltage reference $V_{REF2}$. The second switch circuit 61 is operated in the second state to couple the second node 59, and in turn the back gate 51 of the second main transistor MP2 to the data output terminal 5 when the voltage on the data output terminal 5 is pulled to the third state, namely, above the second voltage reference $V_{REF2}$. By coupling the back gate 51 of the second main transistor MP2 to the data output terminal 5 when the voltage on the data output terminal 5 is pulled to the third state, the voltage across the base-emitter of the parasitic bipolar transistor $Q_{p3}$ is held at zero volts, as is the voltage across the parasitic diode $D_{p4}$ held at zero volts. Thereby, the parasitic bipolar transistor $Q_{p3}$ and the parasitic diode $D_{p4}$ are held in the off-state when the voltage on the data output terminal 5 is pulled by the data bus to the third state, thus preventing the sourcing of current from the data bus to the first rail 2 through the parasitic transistor $Q_{p3}$, and to the second rail 3 through the parasitic diode $D_{p4}$, which would otherwise arise if the back gate 51 of the second main transistor MP2 were coupled to the second rail 3.

The second switch circuit 61 is substantially similar to the first switch circuit 29 and comprises first and second switch elements, namely, first and second control transistors MP12 and MP13, which in this case are provided by PMOS field effect transistors with independently configurable back gates 62 and 63. The first control transistor MP12 selectively couples the second node 59 to the second rail 3, and the second control transistor MP13 selectively couples the second node 59 to the data output terminal 5. Sources 64 and 65 of the first and second control transistors MP12 and MP13, respectively, are coupled to the second node 59. Drains 66 and 67 of the first and second control transistors MP12 and MP13, respectively, are coupled to the second rail 3, and the data output terminal 5, respectively.

The back gates 62 and 63 of the first and second control transistors MP12 and MP13, respectively, are coupled to the respective sources 64 and 65 of the first and second control transistors MP12 and MP13, for preventing parasitic diodes (not shown) between the sources 64 and 65 and back gates 62 and 63 of the respective first and second control transistors MP12 and MP13 being forward biased when the voltage on the data output terminal is pulled to the third state. When the voltage on the data output terminal 5 is in the third state, the first control transistor MP12 is in the off-state, and the second control transistor MP13 is in the on-state, a parasitic diode $D_{pc4}$ of the first control transistor MP12 is reversed biased, and the voltage across a parasitic diode $D_{pc5}$ of the second control transistor MP13 is zero volts. Accordingly, the first and second control transistors MP12 and MP13 present a high impedance on the data output terminal 5 to the data bus when the voltage on the data output terminal 5 is pulled to the third state above the second voltage reference $V_{REF2}$.

A second monitoring circuit provided by a second comparator 68 compares the voltage on the data output terminal 5 with the second voltage reference $V_{REF2}$ which is applied to a second reference voltage terminal 69. For as long as the voltage on the data output terminal 5 remains in the first or second states, namely, at or below the second voltage reference $V_{REF2}$, the second comparator 68 outputs a second switch control signal on its output 70 in a first state, namely, in a logic high state, which is applied through a second inverter 71 to the gate 72 of the first control transistor MP12, and is applied directly to the gate 73 of the second control transistor MP13 for operating the second switch circuit 61 in the first state with the first control transistor MP12 in the on-state and the second control transistor MP13 in the off-state. Thus, while the voltage on the data output terminal is at or below the second voltage reference $V_{REF2}$, the second node 59 is held coupled to the second rail 3 and decoupled from the data output terminal 5 for normal operation of the interface circuit 50 for outputting data on the data output terminal 5. When the voltage on the data output terminal 5 is pulled by the voltage on the data bus to the third state above the second voltage reference $V_{REF2}$, the second comparator 68 outputs the second switch control signal on its output 70 in a second state, namely, in a logic low state for operating the second switch circuit 61 in the second state with the first control transistor MP12 in the off-state and the second control transistor MP13 in the on-state, thereby decoupling the second node 59 from the second rail 3 and coupling the second node 59 to the data output terminal 5.

The inverted second switch control signal from the second inverter 71 is applied to the data control circuit 6. When the enabling circuit 16 is in the enabled state, and the voltage on the data output terminal 5 is in the third state, the data control circuit 6 is responsive to the inverted second switch control signal being in the logic high state, which corresponds to the second state of the second switch control signal, for outputting the second data control signal on the second data control line 9 in the logic high state for operating the second main transistor MP2 in the off-state. However, when the enabling circuit 16 is enabled and the voltage on the data output terminal 5 is in the third state, the state of the first data control signal on the first data control line 8 is determined by the data being transmitted, and thus, may be in the logic high or the logic low state. This, thus, permits the voltage on the data output terminal 5 to be pulled to ground by the first main transistor MN1, when the first data control signal is in the logic high state, in the event that the voltage on the data output terminal 5 is in the third state as a result of a previous data transmission on the data bus by another device. Once the voltage on the data output terminal is pulled to the first state from the third state, the second switch circuit 61 is operated in the first state, and data transmission can commence or continue. As in the case of the interface circuit 1, current limiting circuitry (not shown) is provided for operating the first main transistor MN1 for limiting the current therethrough to a safe level in the event that the voltage on the data output terminal 5 continues to be held in the third state as a result of a fault on the data bus, until appropriate action has been taken by controlling software, which will be well known to those skilled in the art.

The operation of the data control circuit 6 in response to the inverted first switch control signal from the first inverter 39 being in the logic low state, which corresponds to the second state of the first switch control signal, when the data output terminal 5 is in the second state is similar to that described with reference to the operation of the data control circuit 6 of the interface circuit 1. When the enabling circuit 16 is enabled, and the voltage on the data output terminal 5 is in the second state, the data control circuit 6 outputs the first data control signal on the first data control line 8 in the logic low state for operating the first main transistor MN1 in the off-state. The state of the second data control signal on the second data control line 9 when the voltage on the data output terminal 5 is in the second state is determined in response to the data being transmitted. Thus, the second data control line 9 may be in the logic high or logic low state, depending on the data being or to be transmitted. This, thus, permits the voltage on the data output terminal 5 to be pulled to the supply voltage $V_{DD}$ in the event of the voltage on the data output terminal 5 being in the second state as a result of a previous transmission on the data bus by another device. Once the voltage on the data output terminal 5 has been pulled to the first state, the first switch circuit 29 is operated in the first state, and data transmission can commence or continue, as the case may be. However, if the voltage on the data output terminal 5 continues to be held in the second state by the data bus as a result of a fault, the current limiting circuitry (not shown) operates the second main transistor MP2 to limit the current being drawn therethrough to a safe level until appropriate action is taken by the controlling software (not shown).

Turning now to the second primary buffer circuit 14, the second primary buffer circuit 14 which comprises the first and second primary transistors MN6 and MP7 is coupled between the first rail 2 and the second node 59, so that for as long as the voltage on the data output terminal 5 remains in the first or second states, the second primary buffer circuit 14 is coupled by the second switch circuit 61 to the second rail 3. However, on the voltage on the data output terminal 5 being pulled by the voltage on the data bus to the third state above the second voltage reference $V_{REF2}$, the second primary buffer circuit 14 is coupled between the first rail 2 and the data output terminal 5 through the second node 59 by the second switch circuit 61. Accordingly, when the voltage on the data output terminal 5 is pulled to the third state, and the second data control signal on the second data control line 9 is in the high state for holding the second main transistor MP2 in the off-state, the voltage on the gate 58 of the second main transistor MP2 follows the voltage on the data output terminal 5, thereby the second main transistor MP2 is held in the off-state. In this embodiment of the invention the second primary buffer circuit 14 is coupled directly to the first rail 2.

While the voltage remains in the first state, the first node 28 is coupled to the first rail 2 and the second node 59 is coupled to the second rail 3 by the respective first and second switch circuits 29 and 61. When the enabling circuit 16 is enabled, operation of the data control circuit 6, the first and second primary and secondary buffer circuits 11, 12, 14 and 15 is similar to that described with reference to the interface circuit 1, and the first and second main transistors MN1 and MP2 are operated in the appropriate ones of the on-state and the off-state for pulling the data output terminal 5 appropriately to the high and low logic states for normal data output. When the enabling circuit 16 is disabled, the first and second data control signals are held in the logic states for holding the first and second main transistors MN1 and MP2 in the off-states.

However, when the voltage on the data output terminal 5 is pulled by the voltage on the data bus into the third state above the second voltage reference $V_{REF2}$, the second node 59, and in turn the back gate 51 of the second main transistor MP2 and the second primary buffer circuit 14 are coupled to the data output terminal 5. This, thus, causes the voltage on the back gate 51 of the second main transistor MP2 to follow the voltage on the data output terminal 5. Thus, the voltage across the base-emitter of the parasitic transistor $Q_{p3}$ is zero, which prevents the parasitic transistor $Q_{p3}$ operating in the on-state, and the voltage across the parasitic diode $D_{p4}$ is also zero, which prevents the parasitic diode $D_{p4}$ operating in the on-state. Thus, no current is sourced from the data bus to the first rail 2 through the parasitic transistor $Q_{p3}$ and no current is sourced from the data bus through the diode $D_{p4}$ to the second rail 3. Additionally, by virtue of the fact that the data control circuit 6 outputs the second data control signal on the second data control line 9 in the logic high state in response to the inverted second switch control signal from the second inverter 71 being in the logic high state, the second primary transistor MP7 of the second primary buffer circuit 14 is operated in the on-state, thus pulling the gate 58 of the second main transistor MP2 to the voltage on the data output terminal 5 through the second switch circuit 61, so that the gate 58 of the main transistor MP2 follows the voltage on the data output terminal 5, thereby holding the second main transistor MP2 in the off-state. Thus, the second main transistor MP2 presents a high impedance on the data output terminal 5 to the data bus.

Additionally, while the voltage on the data output terminal lies between the supply voltage $V_{DD}$ on the second rail 3 and the second voltage reference $V_{REF2}$, although the back gate 51 of the second main transistor MP2 is coupled to the second rail 3, the voltage drop across the base-emitter of the parasitic transistor $Q_{p3}$ is insufficient to forward bias the parasitic transistor $Q_{p3}$ in the on-state, and similarly, the voltage drop across the parasitic diode $D_{p4}$ is insufficient to forward bias the parasitic diode $D_{p4}$ into the on-state, and thus, the parasitic transistor $Q_{p3}$ and the parasitic diode $D_{p4}$ present a high impedance to the data output terminal 5.

In use, while the enabling circuit 16 is disabled, the data control circuit 6 outputs the first and second data control signals on the data control lines 8 and 9 in the logic low and logic high states, respectively for holding the first and second main transistors MN1 and MP2 in the high impedance off-states.

When the enabling circuit 16 is enabled, and while the voltage on the data output terminal 5 is in the first state, the first switch control signal on the output 38 of the first comparator 36 is in the first state, namely, the logic low state, and the second switch control signal on the output 70 of the second comparator 68 is in the first state, namely, the logic high state. With the first and second switch control signals in the respective logic low and logic high states, the first switch circuit 29 is operated in the first state for coupling the first node 28 to the first rail 2, and the second switch circuit 61 is operated in the first state for coupling the second node 59 to the second rail 3. Thus, the back gate 24 of the first main transistor MN1 is coupled to the first rail 2, and the first primary buffer circuit 11 is coupled between the second rail 3 and the first rail 2. The back gate 51 of the second main transistor MP2 is coupled to the second rail 3 and the second primary buffer circuit 14 is coupled between the second rail 3 and the first rail 2. In this state, data is outputted on the data output terminal 5 in response to data on the data input 7, the data control circuit 6 outputs the first and second data control signals on the first and second data control lines 8 and 9 in the appropriate logic states for operating the first and second main transistors MN1 and MP2 in the appropriate ones of the on-state and the off-state for pulling the data output terminal 5 to the appropriate one of the logic high and the low states.

Figure 1:
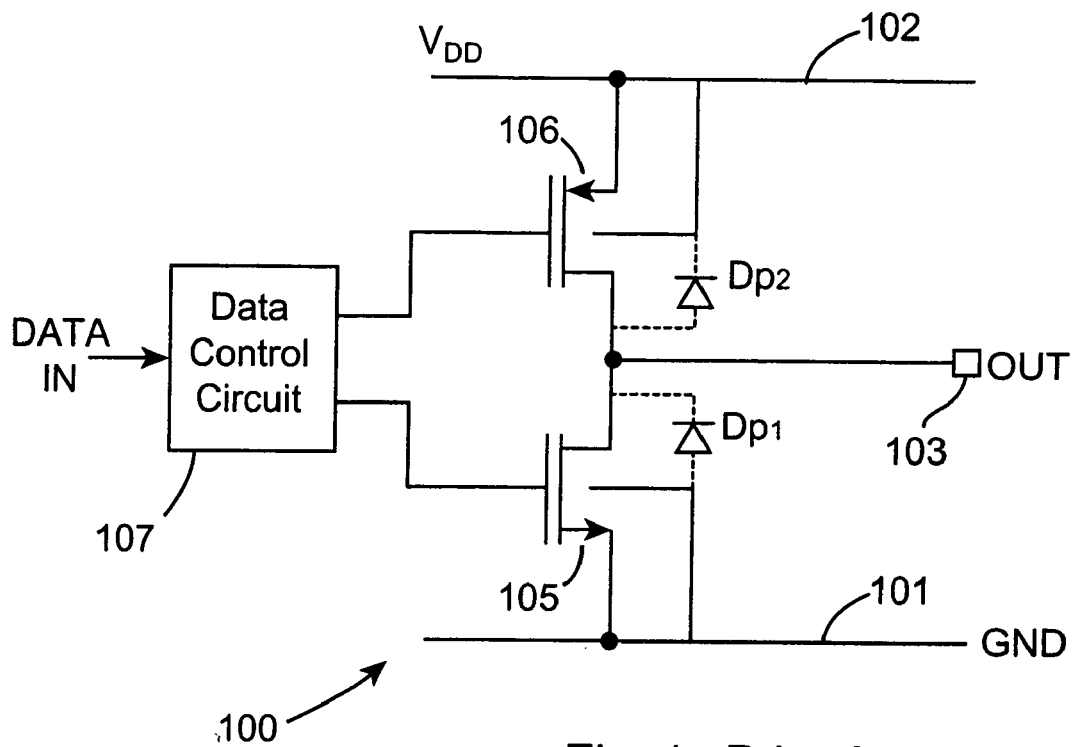
FIG. 1 is a circuit diagram of a prior art output stage interface circuit.

When the enabling circuit 16 is disabled, and the voltage on the data output terminal is pulled to the second state by the voltage on the data bus, the first comparator 36 outputs the first switch control signal on the output 38 in the second logic high state, thereby operating the first switch circuit 29 in the second state with the first node 28 coupled to the data output terminal 5. The second comparator 68 continues to output the second switch control signal in the logic high state, and thus the second control circuit 60 continues to couple the second node 59 to the second rail 3. Since the enabling circuit 16 is disabled, the first and second data control signals outputted by the data control circuit 6 will be in the logic states for holding the first and second main transistors MN1 and MP2 in the off-state as already described with reference to FIG. 1. Since the gate 10 of the first main transistor MN1 is coupled to the data output terminal 5, and thus follows the voltage on the data output terminal 5, the first main transistor MN1 remains in the off-state. Thus, as already described with reference to the interface circuit 1 of FIGS. 2 to 5, the first main transistor MN1 and its parasitic transistor $Q_{p1}$ and its parasitic diode $D_{p2}$ present a high impedance on the data output terminal 5 to the data bus. While the voltage on the data output terminal 5 is in the second state and the second data control signal is in the logic high state, the second main transistor MP2 remains in the off-state, and since the parasitic transistor $Q_{p3}$ and the parasitic diode $D_{p4}$ of the second main transistor MP2 will be reversed biased, the second main transistor MP2 also presents a high impedance on the data output terminal 5 to the data bus when the voltage on the data output terminal 5 is pulled to the second state. Thus, for as long as the voltage on the data output terminal 5 is pulled to the second state, while the enabling circuit 16 is disabled, the interface circuit 50 presents a high impedance on the data output terminal 3 to the data bus.

However, when the voltage on the data output terminal 5 is pulled to the second state by the voltage on the data bus, and the enabling circuit 16 is enabled, operation of the interface circuit 50 is similar to that described above, with the exception that since the data control circuit 6 in response to the inverted first switch control signal being in the logic low state outputs the first data control signal in the logic low state for holding the first main transistor MN1 in the off-state. In this case the state of the second data control signal on the second data control line 9 is determined by the data control circuit 6 in response to the data being or to be transmitted. Thus, the second data control signal may be in the logic high or logic low state. As discussed above, this permits the voltage on the data output terminal 5 to be pulled to the supply voltage $V_{DD}$ when the second data control signal is in the logic low state, if the voltage on the data output terminal is in the second state as a result of a previous data transmission, thereby allowing data transmission to commence or continue. However, if the voltage on the data output terminal is in the second state as a result of a fault on the data bus, the current limiting circuitry (not shown) operates the second main transistor MP2 to limit the current being drawn therethrough until appropriate action is taken by the software (not shown).

When the enabling circuit 16 is disabled, and the voltage on the data output terminal 5 is pulled to the third state by the voltage on the data bus, the first comparator 36 continues to output the first switch control signal in the first logic low state which continues to operate the first switch circuit 29 in the first state for coupling the first node 28 to the first rail 2. However, the second comparator 68 outputs the second switch control signal on the output 70 in the second logic low state, which in turn operates the second switch circuit 61 in the second state for coupling the second node 59 to the data output terminal 5 and decoupling the second node 59 from the second rail 3. Since the enabling circuit 16 is disabled, the data control circuit 6 outputs the first data control signal on the first data control line 8 in the logic low state and the second data control signal on the second data control line 9 in the logic high state, thereby operating the first and second main transistors MN1 and MP2 in the off-state. Since the gate 58 of the second main transistor MP2 is coupled to the data output terminal 5, and thus follows the voltage on the data output terminal 5, the second main transistor MP2 remains in the off-state. Thus, the second main transistor MP2 and its parasitic transistor $Q_{p3}$ and parasitic diode $D_{p4}$ present a high impedance on the data output terminal 5 to the data bus. While the voltage on the data output terminal 5 is in the third state and the first data control signal is in the logic low state, the first main transistor MN1 remains in the off-state, and since the parasitic diode $D_{p2}$ and the parasitic transistor $Q_{p1}$ of the first main transistor MN1 will be reverse biased, the first main transistor MN1 also presents a high impedance on the data output terminal 5 to the data bus.

Accordingly, when the enabling circuit 16 is disabled, and when the data output terminal 5 is pulled to the third state by the voltage on the data bus, the interface circuit 50 presents a high impedance on the data output terminal 5 to the data bus.

However, when the enabling circuit 16 is enabled, and the voltage on the data output terminal is pulled to the third state, operation of the interface circuit 50 is similar to that described above, with the exception that since the data control circuit 6 in response to the inverted second switch control signal being in the logic high state outputs the second data control signal in the logic high state for holding the second main transistor MP2 in the off-state. Additionally, the state of the first data control signal on the first data control line 8 is determined by the data control circuit 6 in response to the data to be or being transmitted. Thus, the first data control signal may be high or low, and as discussed above, this permits the voltage on the data output terminal 5 to be pulled to ground by the first main transistor MN1 when the first data control signal is in the logic high state to permit data transmission to commence or continue as described above, if the voltage on the data output terminal 5 is in the third state as a result of a previous data transmission. However, if the voltage on the data output terminal 5 continues to be held in the third state as a result of a fault on the data bus, the current limiting circuitry (not shown) operates the first main transistor MN1 to limit the current being drawn therethrough until appropriate action has been taken by the software (not shown).

Eight operating conditions in which the interface circuit 50 may operate are set out in FIG. 9.

Figure 10:
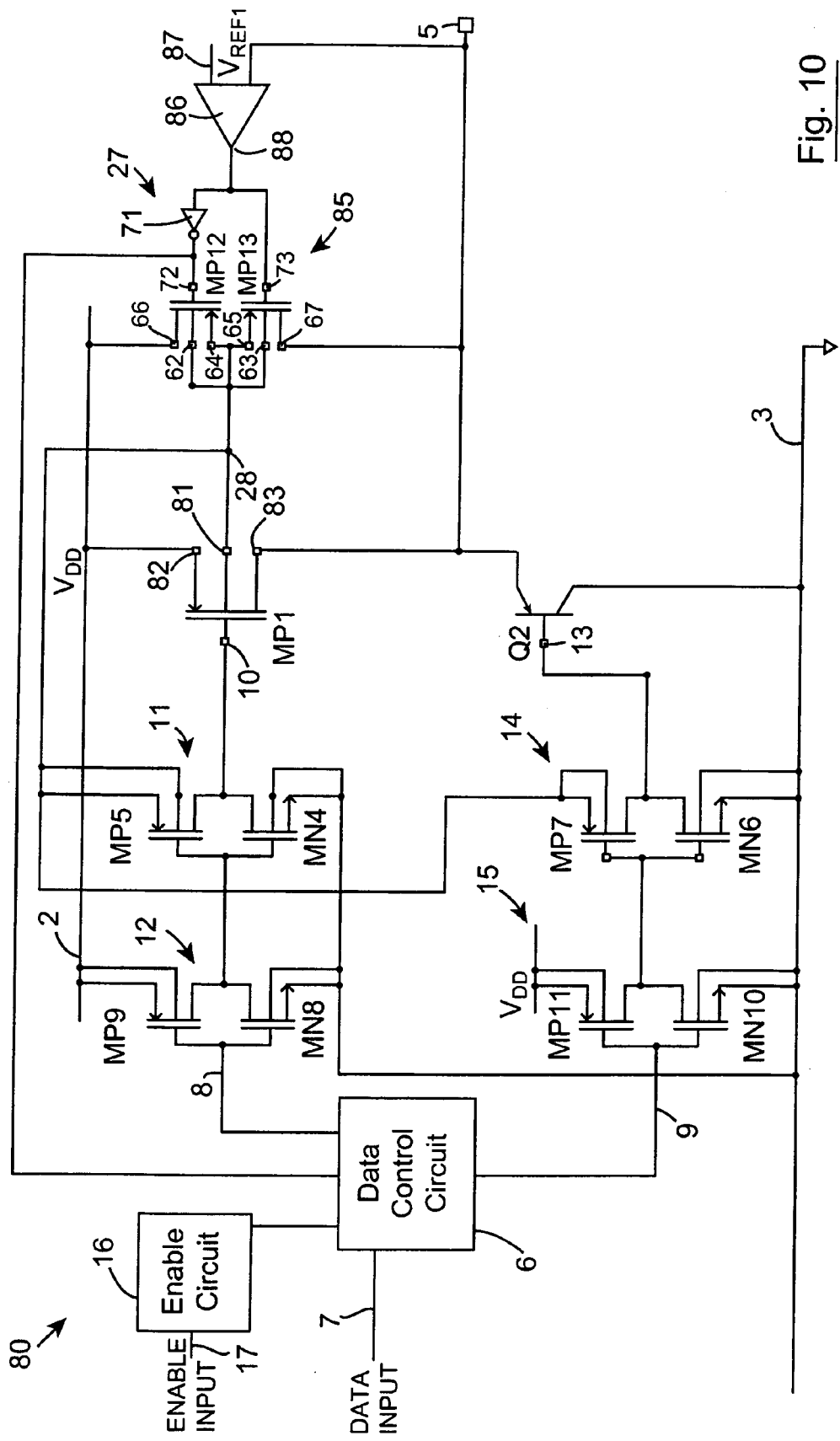
FIG. 10 is a circuit diagram of an output stage interface circuit according to another embodiment of the invention.

Referring now to FIG. 10, there is illustrated an output stage interface circuit according to another embodiment of the invention, indicated generally by the reference numeral 80. The interface circuit 80 is substantially similar to the interface circuit 1 and where relevant, similar components are identified by the same reference numerals and letters. In fact, the interface circuit 80 is effectively the reverse of the interface circuit 1. In this case the high voltage $V_{DD}$ of the supply voltage is applied to the first rail 2, and the low voltage, namely, ground of the supply voltage is applied to the second rail 3. The first main transistor MP1 in this case is a PMOS field effect transistor which is similar to the second main transistor MP2 of the output stage interface circuit 50, and has an independently configurable back gate 81. The first main transistor MP1 is coupled between the data output terminal 5 and the first rail 2 for selectively pulling the data output terminal 5 to the voltage $V_{DD}$ on the first rail 2. The source 82 and drain 83 of the first main transistor MP1 are coupled to the first rail 2 and the data output terminal 5, respectively. The second main transistor Q2 in this case is a substrate PNP bipolar transistor and is coupled between the data output terminal 5 and the second rail 3 for selectively pulling the data output terminal 5 to ground voltage on the second rail 3. The emitter and the collector of the second main transistor Q1 are coupled to the data output terminal 5 and the second rail 3, respectively.

In this case, the interface circuit 80 is implemented by a BiCMOS process on a P-substrate.

The back gate 81 of the first main transistor MP1 and the first and second primary buffer circuits 11 and 14 are coupled to the first node 28. The first control circuit 27 is provided by a first switch circuit 85 for selectively and alternately coupling the first node 28 to either the first rail 2 or the data output terminal 5 in response to the voltage on the data output terminal being in one of a first or second states. In this embodiment of the invention the second state is a voltage above a first voltage reference $V_{REF1}$, which in this embodiment of the invention is less than a diode voltage drop above the high voltage $V_{DD}$ on the first rail 2 of the supply voltage, as will be described below. Thus, in this embodiment of the invention the voltage on the data output terminal 5 is in the first state for so long as the voltage thereon is equal to or less than the first voltage $V_{REF1}$, and the voltage on the data output terminal 5 is in the second state when the voltage thereon is above the first voltage reference $V_{REF1}$.

The first switch circuit 85 is similar to the second switch circuit 61 of the output stage interface circuit 50, and similar components are identified by the same reference numerals and letters. A first monitoring circuit comprising a first comparator 86 which is similar to the second comparator 68 of the output stage interface circuit 50, compares the voltage on the data output terminal 5 with the first voltage reference $V_{REF1}$ applied to a voltage reference terminal 87, and outputs a first switch control signal on an output 88 in response to the state of the voltage on the data output terminal 5. When the voltage on the data output terminal 5 is in the first state, namely, at or below the first voltage reference $V_{REF1}$, the first comparator 86 outputs the first switch control signal in a first state, namely, a logic high state for operating the first switch circuit 85 in the first state with the first control transistor MP12 in the on-state and the second control transistor MP13 in the off-state for coupling the first node 28 to the first rail 2, and decoupling the first node 28 from the data output terminal 5. When the voltage on the data output terminal 5 is pulled above the first voltage reference $V_{REF1}$ to the second state, the first comparator 86 outputs the first switch control signal in a second state, namely, in a logic low state for operating the first switch circuit 85 in the second state with the first control transistor MP12 in the off-state and the second control transistor MP13 in the on-state for coupling the first control terminal 28 to the data output terminal 5 and for decoupling the first node 28 from the second rail 2.

Accordingly, operation of the interface circuit 80 is effectively the reverse of the operation of the interface circuit 1, and further descriptions should not be required.

Figure 11:
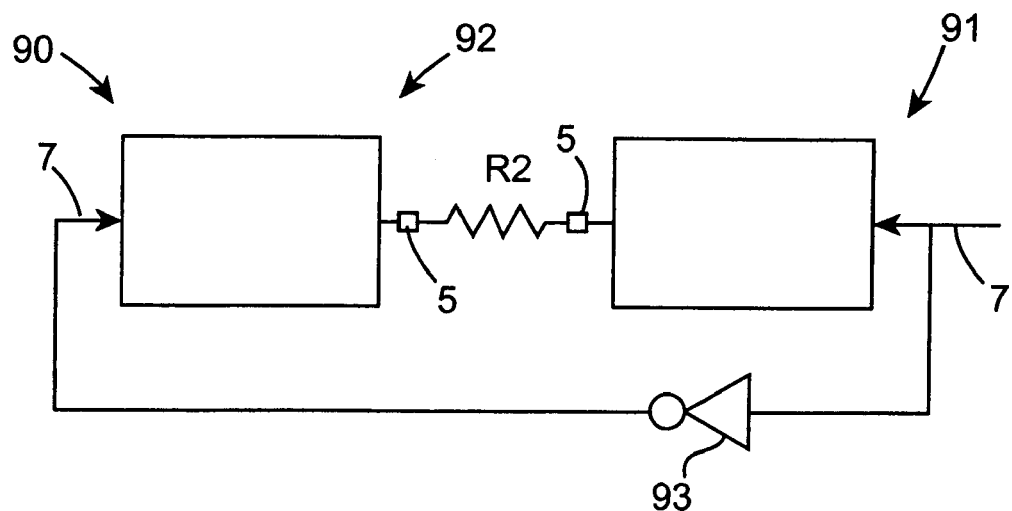
FIG. 11 is a block representation of an output stage interface circuit according to another embodiment of the invention.

Referring now to FIG. 11, there is illustrated a differential output stage interface circuit according to another embodiment of the invention, which is indicated generally by the reference numeral 90, for interfacing a digital data processing circuit (not shown) with a shared differential data bus (also not shown) but represented by a resistor R2. The differential data bus may, for example, be a data bus operating to the RS485 transmission standard, for outputting digital data onto the differential data bus. The differential output stage interface circuit 90 comprises two output stage interface circuits 91 and 92, which are illustrated in block representation only, but which are both identical to the output stage interface circuit 1. The data output terminals 5 of the interface circuits 91 and 92 are coupled to the respective lines of the differential data bus. The digital data input signal from the digital signal processing circuit (not shown) is applied directly to the data input 7 of the data control circuit 6 of the interface circuit 91, and is applied to the data input 7 of the data control circuit 6 of the interface circuit 92 through an inverter 93 for inverting thereof. Otherwise, operation of the differential interface circuit 90 and the interface circuits 91 and 92 is similar to that already described with reference to the interface circuit 1.

While the differential output stage interface circuit 90 of FIG. 11 has been described as comprising two output stage interface circuits 91 and 92 which are similar to the interface circuit 1, it will be readily apparent to those skilled in the art that the differential output stage interface circuit 90 could be provided with two interface circuits identical to the interface circuits 50, or with two interface circuits identical to the interface circuits 80.

While the interface circuits have been described as being implemented by BiCMOS and CMOS processes on a P-substrate, it is envisaged that the interface circuits may be implemented on an N-substrate by a BiCMOS or a CMOS process, as appropriate. In which case the PMOS transistors would be substrate isolation transistors instead of NMOS transistors.

While the interface circuits have been described as being suitable for low voltage CMOS and BiCMOS processes, where supply voltages typically are of the order of 5 volts or less, it will be readily apparent to those skilled in the art that the interface circuits may be used in conjunction with higher or lower supply voltages, and may be implemented by other processes besides CMOS and BiCMOS processes.

While the interface circuits have been described with the first main MOS transistors as being provided by substrate isolated MOS transistors, and the isolation is provided by diffusion isolation, in certain cases, it is envisaged that the first main MOS transistors may be provided by substrate isolated MOS transistors where the isolation would be provided by trench isolation. In other words, in such cases the main MOS transistors would be provided by trench isolated MOS devices. However, where the first main MOS transistors are provided by trench isolated MOS devices, it will be appreciated that the trench isolation would typically be formed by an oxide or other dielectric material, and thus coupling of the trench isolation to the appropriate voltage rail would not be required, since the parasitic diode which exists in the diffusion isolated MOS transistors between the back gate and the diffusion isolation would not exist between the back gate and the dielectric isolation of the trench isolated MOS device. Needless to say, other diffusion isolated MOS transistors in the interface circuits could similarly be replaced by trench isolated MOS transistors.

While the first and second control circuits and in turn the first and second switch circuits have been described as being responsive to the outputs of respective first and second comparators being indicative of the voltage on the data output terminal being pulled by the data bus to either the second or third states, as the case may be, for coupling the respective first and second nodes to the data output terminal, it will be readily apparent to those skilled in the art that any other suitable means or circuitry for detecting the voltage on the data output terminal being pulled to the second or third states may be provided. Indeed, it is envisaged that if the first and second MOS transistors were ideal, the gate of the first control transistor MN2 could be coupled directly to the data output terminal, and the gate of the second control transistor MN3 could be coupled to the data output terminal through an inverter, in the case of the output stage interface circuits 50 and 80, the gate of the first control transistor MP12 could be coupled directly to the data output terminal 5 and the gate of the second control transistor MP1 3 could be coupled through an inverter to the data output terminal 5 in the case of the output stage interface circuits 50 and 80.

While in the interface circuits 1, 50 and 80 the first voltage reference has been selected to be below the voltage on the first rail, and the second voltage reference has been selected to be above the voltage on the second rail, in certain cases it is envisaged that the value of the first voltage reference may be selected to be slightly above the voltage on the first rail, even where the voltage on the first rail is the low voltage, and the second voltage reference may be selected to be slightly below the voltage on the second rail, even where the voltage on the second rail is the high voltage, however, in all cases, it is envisaged that the voltage of the first and second voltage references will be held to be within a voltage less than a diode voltage drop away from the voltage on the relevant first and second rails, although, in an ideal circuit, the value of the first voltage reference would be selected to be equal to the value of the voltage on the first rail, and the second voltage reference would be selected to be equal to the value of the voltage on the second rail.

While the first and second primary buffer circuits have been described as being selectively coupleable to the first and second rails, as the case may be, and to the data output terminal through the appropriate first and second control circuits, it will be appreciated that the first and second primary buffer circuits may be selectively coupleable to the first and second rails, as the case may be, and to the data output terminal through respective separate switch circuits independently of the first and second switch circuits.

While the output stage interface circuits described with reference to FIGS. 2 to 11 have been described as comprising first and second main switch elements, it is envisaged in certain cases that an output stage interface circuit according to the invention may be provided with a first main switch element only, and in which case, the data output terminal would be coupled to the first rail by the first main switch element, which would be provided by a first main MOS device, and the data output terminal would be coupled to the second rail by, for example, a pull-up or a pull-down resistor, as the case may be. In which case, a first control circuit would be provided which would be responsive to the voltage on the data output terminal being pulled from a first state to a second state across a first voltage reference related to the voltage on the first rail for coupling the back gate of the first main MOS device to the data output terminal, and for accommodating coupling of the gate of the first main MOS device to the data output terminal, so that the first main MOS device would present a high impedance on the data output terminal to the data bus when the voltage on the data output terminal is pulled to the second state. The first control circuit would be responsive to the voltage on the data output terminal being in the first state for coupling the back gate of the first main MOS device to the first rail and for accommodating selective coupling of the gate of the first main MOS device to the first rail, while the voltage on the data output terminal remained in the first state. The voltage on the first rail could be the high voltage or the low voltage of the supply voltage, and the voltage on the second rail would be the other of the high and low voltages of the supply voltage.

It is envisaged that in certain cases the current limiting resistor R1 in the output stage interface circuits described with reference to FIGS. 2 to 11 may be omitted.

The invention claimed is:

1. An output stage interface circuit for interfacing with a data bus, the interface circuit comprising:
a first rail for receiving one of a high voltage and a low voltage of a power supply voltage,
a second rail for receiving the other of the high voltage and the low voltage of the power supply voltage,
a data output terminal for outputting data to the data bus,
a first main switch element coupled between the data output terminal and the first rail for selectively determining at least one of a logic high and a logic low state of the data output terminal, the first main switch element comprising a first main MOS device having a gate and an independently configurable back gate, and being responsive to a first data control signal applied to the gate thereof for pulling the voltage on the data output terminal towards the voltage on the first rail for determining the one of the logic high and the logic low states of the data output terminal, and
a first control circuit responsive to the voltage on the data output terminal being pulled from a first state across a first voltage reference to a second state for coupling the back gate of the first main MOS device to the data output terminal and for accommodating coupling of the gate of the first main MOS device to the data output terminal, so that the first main MOS device presents a high impedance on the data output terminal when the voltage on the data output terminal is pulled to the second state.

2. An output stage interface circuit as claimed in claim 1 in which the first voltage reference is selected to be of value so that the back gate of the first main MOS device is coupled to the data output terminal prior to the voltage on the data output terminal being pulled to a voltage sufficient to forward bias parasitic elements of the first main MOS device into a conducting state.

3. An output stage interface circuit as claimed in claim 1 in which the first voltage reference is selected to be of value so that the difference between the value of the first voltage reference and the value of the voltage on the first rail is less than a diode voltage drop.

4. An output stage interface circuit as claimed in claim 1 in which the first voltage reference is selected to be of value so that the value of the voltage on the first rail lies between the value of the first voltage reference and the value of the voltage on the second rail.

5. An output stage interface circuit as claimed in claim 1 in which the first control circuit is responsive to the voltage on the data output terminal being in the first state for coupling the back gate of the first main MOS device to the first rail.

6. An output stage interface circuit as claimed in claim 1 in which the first control circuit is responsive to the voltage on the data output terminal being in the first state for accommodating selective coupling of the gate of the first main MOS device to the first rail in response to the first data control signal.

7. An output stage interface circuit as claimed in claim 1 in which the first control circuit comprises a first switch circuit alternately operable in a first state and a second state in response to the respective first and second states of the voltage on the data output terminal, so that in the first state of the first switch circuit the back gate of the first main MOS device is coupled to the first rail and decoupled from the data output terminal, and in the second state of the first switch circuit the back gate of the first main MOS device is coupled to the data output terminal and decoupled from the first rail.

8. An output stage interface circuit as claimed in claim 7 in which the first switch circuit comprises a pair of switch elements, one of the switch elements being provided for selectively coupling the back gate of the first main MOS device to the first rail, and the other of the switch elements being provided for selectively coupling the back gate of the first main MOS device to the data output terminal.

9. An output stage interface circuit as claimed in claim 8 in which the switch elements of the first switch circuit comprise respective MOS devices, each having an independently configurable back gate, the back gates of the respective MOS devices being coupled to one of the source and drain of the corresponding MOS device for preventing parasitic elements in the MOS devices being sufficiently forward biased to conduct current when the voltage on the data output terminal is in the second state, so that the first switch circuit presents a high impedance on the data output terminal when the voltage thereon is in the second state.

10. An output stage interface circuit as claimed in claim 1 in which a first primary buffer circuit is provided through which the first data control signal is applied to the gate of the first main MOS device, the first primary buffer circuit being coupled to the first control circuit, so that the first primary buffer circuit is coupled to the first rail in response to the voltage on the data output terminal being in the first state, and to the data output terminal in response to the voltage thereon being in the second state.

11. An output stage interface circuit as claimed in claim 10 in which the first primary buffer circuit is coupled between the second rail and the first control circuit.

12. An output stage interface circuit as claimed in claim 10 in which a data control circuit is provided for producing the first data control signal, the data control circuit being responsive to the voltage on the data output terminal being pulled to the second state for outputting the first data control signal in a state to operate the first primary buffer circuit for coupling the gate of the first main MOS device to the first control circuit.

13. An output stage interface circuit as claimed in claim 1 in which a first monitoring circuit is provided for monitoring the state of the voltage on the data output terminal, the first monitoring circuit being responsive to the voltage on the data output terminal for outputting a first switch control signal in one of a first state and a second state corresponding to the respective first and second states of the voltage on the data output terminal, the first control circuit being responsive to the first switch control signal being in the second state for coupling the back gate of the first main MOS device to the data output terminal, and for accommodating coupling of the gate of the first main MOS device to the data output terminal.

14. An output stage interface circuit as claimed in claim 1 in which a second main switch element is coupled between the data output terminal and the second rail, the second main switch element comprising a control terminal for receiving a second data control signal, the second main switch element being responsive to the second data control signal for pulling the voltage on the data output terminal towards the voltage on the second rail for determining the other one of the logic high state and the logic low states of the data output terminal.

15. An output stage interface circuit as claimed in claim 14 in which the second main switch element comprises a bipolar transistor, a base of the bipolar transistor forming the control terminal for receiving the second data control signal.

16. An output stage interface circuit as claimed in claim 15 in which the first control circuit is responsive to the voltage on the data output terminal being pulled from the first state across the first voltage reference to the second state for accommodating coupling of the base of the bipolar transistor to the data output terminal.

17. An output stage interface circuit as claimed in claim 15 in which a second primary buffer circuit is provided through which the second data control signal is applied to the base of the bipolar transistor, the second primary buffer circuit being coupled to the first control circuit, so that the second primary buffer circuit is coupled to the first rail in response to the voltage on the data output terminal being in the first state, and to the data output terminal in response to the voltage thereon being in the second state.

18. An output stage interface circuit as claimed in claim 17 in which the second primary buffer circuit is coupled between the second rail and the first control circuit.

19. An output stage interface circuit as claimed in claim 14 in which the second main switch element comprises a second main MOS device having a gate and an independently configurable back gate, the gate forming the control terminal for receiving the second data control signal, and a second control circuit is provided responsive to the voltage on the data output terminal being pulled from the first state across a second voltage reference to a third state for coupling the back gate of the second main MOS device to the data output terminal and for accommodating coupling of the gate of the second main MOS device to the data output terminal, so that the second main MOS device presents a high impedance to the data output terminal when the voltage on the data output terminal is pulled to the third state.

20. An output stage interface circuit as claimed in claim 19 in which the second voltage reference is selected to be of value so that the back gate of the second main MOS device is coupled to the data output terminal prior to the voltage on the data output terminal being pulled to a voltage sufficient to forward bias parasitic elements of the second main MOS device into a conducting state.

21. An output stage interface circuit as claimed in claim 19 in which the second voltage reference is selected to be of value so that the difference between the value of the second voltage reference and the value of the voltage on the second rail is less than a diode voltage drop.

22. An output stage interface circuit as claimed in claim 19 in which the second voltage reference is selected to be of value so that the value of the voltage on the second rail lies between the value of the second voltage reference and the value of the voltage on the first rail.

23. An output stage interface circuit as claimed in claim 19 in which the second control circuit is responsive to the voltage on the data output terminal being in the first state for coupling the back gate of the second main MOS device to the second rail.

24. An output stage interface circuit as claimed in claim 19 in which the second control circuit is responsive to the voltage on the data output terminal being in the first state for accommodating selective coupling of the gate of the second main MOS device to the second rail in response to the second data control signal.

25. An output stage interface circuit as claimed in claim 19 in which the second control circuit comprises a second switch circuit alternately operable in a first state and a second state in response to the respective first and third states of the voltage on the data output terminal, so that in the first state of the second switch circuit, the back gate of the second main MOS device is coupled to the second rail, and decoupled from the data output terminal, and in the second state of the second switch circuit the back gate of the second main MOS device is coupled to the data output terminal and decoupled from the second rail.

26. An output stage interface circuit as claimed in claim 25 in which the second switch circuit comprises a pair of switch elements, one of the switch elements being provided for selectively coupling the back gate of the second main MOS device to the second rail, and the other one of the switch elements being provided for selectively coupling the back gate of the second main MOS device to the data output terminal.

27. An output stage interface circuit as claimed in claim 26 in which the switch elements of the second switch circuit comprise respective MOS devices, each having an independently configurable back gate, the back gates of the respective MOS devices being coupled to one of the source and drain of the corresponding MOS device for preventing parasitic elements in the MOS devices being sufficiently forward biased to conduct current when the voltage on the data output terminal is in the third state, so that the second switch circuit presents a high impedance on the data output terminal when the voltage thereon is in the third state.

28. An output stage interface circuit as claimed in claim 19 in which a second primary buffer circuit is provided through which the second data control signal is applied to the gate of the second main MOS device, the second primary buffer circuit being coupled to the second control circuit, so that the second primary buffer circuit is coupled to the second rail in response to the voltage on the data output terminal being in the first state, and to the data output terminal in response to the voltage thereon being in the third state.

29. An output stage interface circuit as claimed in claim 28 in which the second primary buffer circuit is coupled between the first rail and the second control circuit.

30. An output stage interface circuit as claimed in claim 28 in which the data control circuit is responsive to the voltage on the data output terminal being in the third state for outputting the second data control signal in a state for operating the second primary buffer circuit to couple the gate of the second main MOS device to the second control circuit.

31. An output stage interface circuit as claimed in claim 19 in which a second monitoring circuit is provided for monitoring the state of the voltage on the data output terminal, the second monitoring circuit being responsive to the voltage on the data output terminal for outputting a second switch control signal in one of a first state and a second state corresponding to the respective first and third states of the voltage on the data output terminal, the second control circuit being responsive to the second switch control signal being in the second state for coupling the back gate of the second main MOS device to the data output terminal, and for accommodating coupling of the gate of the second main MOS device to the data output terminal.

32. An output stage interface circuit as claimed in claim 14 in which the data control circuit is adapted for receiving digital data signals from a digital signal processing circuit, and for producing the first and second data control signals in response to the received digital data signal.

33. An output stage interface circuit as claimed in claim 1 in which the first rail is adapted for receiving the low voltage of the high and low voltages of the supply voltage, and the second rail is adapted for receiving the high voltage of the high and low voltages of the supply voltage.

34. An output stage interface circuit as claimed in claim 1 in which the first rail is adapted for receiving the high voltage of the high and low voltages of the supply voltage, and the second rail is adapted for receiving the low voltage of the high and low voltages of the supply voltage.

35. An output stage interface circuit as claimed in claim 1 in which the interface circuit is implemented by one of a CMOS and a BiCMOS process on one of a P-substrate and an N-substrate, and the first main MOS device is a first main substrate isolated MOS device.

36. An output stage interface circuit as claimed in claim 35 in which the first main substrate isolated MOS device is a diffusion isolated MOS device having a diffused isolation well of one of P and N type different to the P and N type of the substrate.

37. An output stage interface circuit as claimed in claim 36 in which the diffused well is coupled to a voltage for preventing a parasitic diode between the diffused well and the back gate of the first main substrate isolated MOS device conducting during normal outputting of data through the data output terminal.

38. An output stage interface circuit as claimed in claim 37 in which the diffused well of the first main substrate isolated MOS device is coupled to the second rail.

39. A differential output stage interface circuit for interfacing with a differential data bus comprising a pair of output stage interface circuits as claimed in claim 1, one of the output stage interface circuits being adapted for receiving a digital data signal directly from a digital data processing circuit, and the other of the output stage interface circuits being adapted to receive the data signal from the data processing circuit through an inverter for inverting thereof, the data output terminals of the respective output stage interface circuits being adapted for coupling to respective differential lines of the differential bus.

40. A differential output stage interface circuit as claimed in claim 39 in which the differential output stage interface circuit is adapted for interfacing with a data bus operating under the RS485 transmission standard.

41. A differential output stage interface circuit for interfacing with a differential data bus comprising a pair of output stage interface circuits as claimed in claim 14, one of the output stage interface circuits being adapted for receiving a digital data signal directly from a digital data processing circuit, and the other of the output stage interface circuits being adapted to receive the data signal from the data processing circuit through an inverter for inverting thereof, the data output terminals of the respective output stage interface circuits being adapted for coupling to respective differential lines of the differential bus.

42. A differential output stage interface circuit as claimed in claim 41 in which the differential output stage interface circuit is adapted for interfacing with a data bus operating under the RS485 transmission standard.

43. An output stage interface circuit as claimed in claim 41 in which the first voltage reference is selected to be of value so that the back gate of the first main MOS device is coupled to the data output terminal prior to the voltage on the data output terminal being pulled to a voltage sufficient to forward bias parasitic elements of the first main MOS device into a conducting state.

44. An output stage interface circuit as claimed in claim 41 in which the first voltage reference is selected to be of value so that the difference between the value of the first voltage reference and the value of the voltage on the first rail is less than a diode voltage drop.

45. An output stage interface circuit for interfacing with a data bus, the interface circuit comprising:
a first rail for receiving a low voltage of a high and low voltages power supply voltage,
a second rail for receiving the high voltage of the high and low voltages of the power supply voltage,
a data output terminal for outputting data to the data bus,
a first main switch element coupled between the data output terminal and the first rail for selectively determining the logic low state of the data output terminal, the first main switch element comprising a first main MOS device having a gate and an independently configurable back gate, and being responsive to a first data control signal applied to the gate thereof for pulling the voltage on the data output terminal towards the voltage on the first rail for determining the logic low state of the data output terminal,
a second main switch element coupled between the data output terminal and the second rail for selectively determining the logic high state of the data output terminal, the second main switch element comprising a second main MOS device having a gate and an independently configurable back gate, and being responsive to a second data control signal applied to the gate thereof for pulling the voltage on the data output terminal towards the voltage on the second rail for determining the logic high state of the data output terminal, a first control circuit responsive to the voltage on the data output terminal being pulled from a first state across a first voltage reference to a second state for coupling the back gate of the first main MOS device to the data output terminal and for accommodating coupling of the gate of the first main MOS device to the data output terminal, so that the first main MOS device presents a high impedance on the data output terminal when the voltage on the data output terminal is pulled to the second state, and a second control circuit responsive to the voltage on the data output terminal being pulled from the first state across a second voltage reference to a third state for coupling the back gate of the second main MOS device to the data output terminal and for accommodating coupling of the gate of the second main MOS device to the data output terminal, so that the second main MOS device presents a high impedance on the data output terminal when the voltage on the data output terminal is pulled to the third state.

46. An output stage interface circuit as claimed in claim 45 in which the first voltage reference is selected to be of value so that the value of the voltage on the first rail lies between the value of the first voltage reference and the value of the voltage on the second rail.

47. An output stage interface circuit as claimed in claim 45 in which the second voltage reference is selected to be of value so that the back gate of the second main MOS device is coupled to the data output terminal prior to the voltage on the data output terminal being pulled to a voltage sufficient to forward bias parasitic elements of the second main MOS device into a conducting state.

48. An output stage interface circuit as claimed in claim 45 in which the second voltage reference is selected to be of value so that the difference between the value of the second voltage reference and the value of the voltage on the second rail is less than a diode voltage drop.

49. An output stage interface circuit as claimed in claim 45 in which the second voltage reference is selected to be of value so that the value of the voltage on the second rail lies between the value of the second voltage reference and the value of the voltage on the first rail.

50. An output stage interface circuit as claimed in claim 45 in which the first control circuit is responsive to the voltage on the data output terminal being in the first state for coupling the back gate of the first main MOS device to the first rail.

51. An output stage interface circuit as claimed in claim 45 in which the first control circuit is responsive to the voltage on the data output terminal being in the first state for accommodating selective coupling of the gate of the first main MOS device to the first rail in response to the first data control signal.

52. An output stage interface circuit as claimed in claim 45 in which the first control circuit comprises a first switch circuit alternately operable in a first state and a second state in response to the respective first and second states of the voltage on the data output terminal, so that in the first state of the first switch circuit the back gate of the first main MOS device is coupled to the first rail and decoupled from the data output terminal, and in the second state of the first switch circuit the back gate of the first main MOS device is coupled to the data output terminal and decoupled from the first rail.

53. An output stage interface circuit as claimed in claim 52 in which the first switch circuit comprises a pair of switch elements, one of the switch elements being provided for selectively coupling the back gate of the first main MOS device to the first rail, and the other of the switch elements being provided for selectively coupling the back gate of the first main MOS device to the data output terminal.

54. An output stage interface circuit as claimed in claim 53 in which the switch elements of the first switch circuit comprise respective MOS devices, each having an independently configurable back gate, the back gates of the respective MOS devices being coupled to one of the source and drain of the corresponding MOS device for preventing parasitic elements in the MOS devices being sufficiently forward biased to conduct current when the voltage on the data output terminal is in the second state, so that the first switch circuit presents a high impedance on the data output terminal when the voltage thereon is in the second state.

55. An output stage interface circuit as claimed in claim 45 in which the second control circuit is responsive to the voltage on the data output terminal being in the first state for coupling the back gate of the second main MOS device to the second rail.

56. An output stage interface circuit as claimed in claim 45 in which the second control circuit is responsive to the voltage on the data output terminal being in the first state for accommodating selective coupling of the gate of the second main MOS device to the second rail in response to the second data control signal.

57. An output stage interface circuit as claimed in claim 45 in which the second control circuit comprises a second switch circuit operable in a first state and a second state in response to the respective first and third states of the voltage on the data output terminal, so that in the first state of the second switch circuit, the back gate of the second main MOS device is coupled to the second rail, and decoupled from the data output terminal, and in the second state of the second switch circuit the back gate of the second main MOS device is coupled to the data output terminal and decoupled from the second rail.

58. An output stage interface circuit as claimed in claim 57 in which the second switch circuit comprises a pair of switch elements, one of the switch elements being provided for selectively coupling the back gate of the second main MOS device to the second rail, and the other one of the switch elements being provided for selectively coupling the back gate of the second main MOS device to the data output terminal.

59. An output stage interface circuit as claimed in claim 58 in which the switch elements of the second switch circuit comprise respective MOS devices, each having an independently configurable back gate, the back gates of the respective MOS devices being coupled to one of the source and drain of the corresponding MOS device for preventing parasitic elements in the MOS devices being sufficiently forward biased to conduct current when the voltage on the data output terminal is in the third state, so that the second switch circuit presents a high impedance on the data output terminal when the voltage thereon is in the third state.

60. An output stage interface circuit as claimed in claim 45 in which a first primary buffer circuit is provided through which the first data control signal is applied to the gate of the first main MOS device, the first primary buffer circuit being coupled to the first control circuit, so that the first primary buffer circuit is coupled to the first rail in response to the voltage on the data output terminal being in the first state, and to the data output terminal in response to the voltage thereon being in the second state.

61. An output stage interface circuit as claimed in claim 60 in which the first primary buffer circuit is coupled between the second rail and the first control circuit.

62. An output stage interface circuit as claimed in claim 60 in which a data control circuit is provided for producing the first and second data control signals, the data control circuit being responsive to the voltage on the data output terminal being pulled to the second state for outputting the first data control signal in a state to operate the first primary buffer circuit for coupling the gate of the first main MOS device to the first control circuit, and the data control circuit being responsive to the voltage on the data output terminal being in the third state for outputting the second data control signal in a state to operate the second primary buffer circuit for coupling the gate of the second main MOS device to the second control circuit.

63. An output stage interface circuit as claimed in claim 45 in which a second primary buffer circuit is provided through which the second data control signal is applied to the gate of the second main MOS device, the second primary buffer circuit being coupled to the second control circuit, so that the second primary buffer circuit is coupled to the second rail in response to the voltage on the data output terminal being in the first state, and to the data output terminal in response to the voltage thereon being in the third state.

64. An output stage interface circuit as claimed in claim 63 in which the second primary buffer circuit is coupled between the first rail and the second control circuit.

65. An output stage interface circuit as claimed in claim 45 in which a first monitoring circuit is provided for monitoring the state of the voltage on the data output terminal, the first monitoring circuit being responsive to the voltage on the data output terminal for outputting a first switch control signal in one of a first state and a second state corresponding to the respective first and second states of the voltage on the data output terminal, the first control circuit being responsive to the first switch control signal being in the second state for coupling the back gate of the first main MOS device to the data output terminal, and for accommodating coupling of the gate of the first main MOS device to the data output terminal.

66. An output stage interface circuit as claimed in claim 45 in which a second monitoring circuit is provided for monitoring the state of the voltage on the data output terminal, the second monitoring circuit being responsive to the voltage on the data output terminal for outputting a second switch control signal in one of a first and second state corresponding to the respective first and third states of the voltage on the data output terminal, the second control circuit being responsive to the second switch control signal being in the second state for coupling the back gate of the second main MOS device to the data output terminal, and for accommodating coupling of the gate of the second main MOS device to the data output terminal.

67. A differential output stage interface circuit for interfacing with a differential data bus comprising a pair of output stage interface circuits as claimed in claim 45, one of the output stage interface circuits being adapted for receiving a digital data signal directly from a digital data processing circuit, and the other of the output stage interface circuits being adapted to receive the data signal from the data processing circuit through an inverter for inverting thereof, the data output terminals of the respective output stage interface circuits being adapted for coupling to respective differential lines of the differential bus.

68. A differential output stage interface circuit as claimed in claim 67 in which the differential output stage interface circuit is adapted for interfacing with a data bus operating under the RS485 transmission standard.

69. A method for operating an output stage interface circuit for presenting a high impedance to a data bus when the voltage on the data bus pulls the voltage on a data output terminal of the output stage interface circuit in one direction outside the power supply voltage range of the output stage interface circuit, wherein the interface circuit comprises:
a first rail for receiving one of a high voltage and a low voltage of the power supply voltage,
a second rail for receiving the other of the high voltage and the low voltage of the power supply voltage,
a data output terminal for outputting data to the data bus,
a first main switch element coupled between the data output terminal and the first rail for selectively determining at least one of a logic high and a logic low state of the data output terminal, the method comprising:
providing the first main switch element as a first main MOS device having a gate and an independently configurable back gate, and being responsive to a first data control signal applied to the gate thereof for pulling the voltage on the data output terminal towards the voltage on the first rail for determining the one of the logic high and the logic low states of the data output terminal, and
coupling the gate and the back gate of the first main MOS device to the data output terminal in response to the voltage on the data output terminal being pulled from a first state across a first voltage reference to a second state outside the power supply voltage of the output stage interface circuit, so that the first main MOS device presents a high impedance to the data output terminal when the voltage on the data output terminal is pulled to the second state.

70. A method as claimed in claim 69 in which the first voltage reference is selected to be of value so that the back gate of the first main MOS device is coupled to the data output terminal prior to the voltage on the data output terminal being pulled to a voltage sufficient to forward bias parasitic elements of the first main MOS device into a conducting state.

71. A method as claimed in claim 69 in which the first voltage reference is selected to be of value so that the difference between the value of the first voltage reference and the value of the voltage on the first rail is less than a diode voltage drop.

72. A method as claimed in claim 69 in which the first voltage reference is selected to be of value so that the value of the voltage on the first rail lies between the value of the first voltage reference and the value of the voltage on the second rail.

73. A method as claimed in claim 69 in which the back gate of the first main MOS device is coupled to the first rail when the voltage on the data output terminal is in the first state.

74. A method as claimed in claim 69 in which the gate of the first main MOS device is selectively coupleable to the first rail in response to the first data control signal when the voltage on the data output terminal is in the first state.

* * * * *